US009368541B2

(12) United States Patent
Kurokawa et al.

(10) Patent No.: US 9,368,541 B2
(45) Date of Patent: Jun. 14, 2016

(54) DISPLAY DEVICE

(75) Inventors: Yoshiyuki Kurokawa, Kanagawa (JP);
Takayuki Ikeda, Kanagawa (JP);
Hikaru Tamura, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 747 days.

(21) Appl. No.: 12/914,656

(22) Filed: Oct. 28, 2010

(65) Prior Publication Data
US 2011/0109592 A1 May 12, 2011

(30) Foreign Application Priority Data

Nov. 6, 2009 (JP) .................................. 2009-255452

(51) Int. Cl.
*G06G 1/00* (2006.01)
*H01L 27/146* (2006.01)
*G06F 3/041* (2006.01)
*G06F 3/042* (2006.01)
*H01L 27/12* (2006.01)
*G02F 1/1333* (2006.01)

(52) U.S. Cl.
CPC .......... *H01L 27/14678* (2013.01); *G06F 3/042* (2013.01); *G06F 3/0412* (2013.01); *G06F 3/0416* (2013.01); *H01L 27/1225* (2013.01); *H01L 27/1464* (2013.01); *H01L 27/14632* (2013.01); *G02F 1/13338* (2013.01)

(58) Field of Classification Search
CPC ................................................ G09G 2360/14
USPC ................................................ 345/173–179
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,191,409 | B1 | 2/2001 | Muramatsu |
| 6,243,069 | B1 | 6/2001 | Ogawa et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,747,638 | B2 | 6/2004 | Yamazaki et al. |
| 7,006,080 | B2 * | 2/2006 | Gettemy ...................... 345/175 |

(Continued)

FOREIGN PATENT DOCUMENTS

| EP | 1122792 A | 8/2001 |
| EP | 1154310 A | 11/2001 |

(Continued)

OTHER PUBLICATIONS

International Search Report (Application No. PCT/JP2010/068649; PCT12885) Dated Feb. 8, 2011.

(Continued)

*Primary Examiner* — Michael Faragalla
(74) *Attorney, Agent, or Firm* — Nixon Peabody LLP; Jeffrey L. Costellia

(57) ABSTRACT

The display device has a display panel where a photosensor and a transistor including an oxide semiconductor layer are arranged. The display device detects a shadow of the object, which is projected on the display panel when the object approaches the display panel and blocks ambient light, with a photosensor, whereby a position or motion of the object is detected. Even when the object is not in contact with the display panel, the object can be detected.

16 Claims, 22 Drawing Sheets

(56) References Cited

U.S. PATENT DOCUMENTS

| | | | |
|---|---|---|---|
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,068,254 B2 | 6/2006 | Yamazaki et al. | |
| 7,105,868 B2 | 9/2006 | Nause et al. | |
| 7,113,215 B2 | 9/2006 | Kokubun | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,365,750 B2 | 4/2008 | Yamazaki et al. | |
| 7,381,991 B2 | 6/2008 | Yamazaki et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,525,523 B2 | 4/2009 | Yamazaki et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,800,602 B2 | 9/2010 | Choi et al. | |
| 7,808,535 B2 | 10/2010 | Kimura | |
| 7,935,582 B2 | 5/2011 | Iwasaki | |
| 7,956,361 B2 | 6/2011 | Iwasaki | |
| 8,089,476 B2 | 1/2012 | Ishiguro et al. | |
| 8,199,083 B2 | 6/2012 | Fukunaga et al. | |
| 8,203,636 B2 | 6/2012 | Kimura | |
| 8,212,793 B2 | 7/2012 | Ishiguro | |
| 8,355,065 B2 | 1/2013 | Kimura | |
| 8,416,225 B2 | 4/2013 | Katoh et al. | |
| 8,456,459 B2 | 6/2013 | Yamazaki et al. | |
| 8,564,580 B2 | 10/2013 | Sakai et al. | |
| 8,581,243 B2 | 11/2013 | Takahashi et al. | |
| 8,619,208 B2 | 12/2013 | Gosain et al. | |
| 8,743,250 B2 | 6/2014 | Kimura | |
| 8,830,217 B2 | 9/2014 | Yamazaki et al. | |
| 9,019,408 B2 | 4/2015 | Kimura | |
| 2001/0030704 A1 | 10/2001 | Kimura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0200953 A1* | 10/2004 | Cok | 250/214 R |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0262055 A1 | 11/2006 | Takahara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0033850 A1* | 2/2009 | Ishiguro et al. | 349/116 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0141004 A1 | 6/2009 | Yamazaki | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0085331 A1 | 4/2010 | Kurokawa et al. | |
| 2010/0090996 A1* | 4/2010 | Chou et al. | 345/207 |
| 2010/0092800 A1 | 4/2010 | Itagaki et al. | |
| 2010/0109002 A1 | 5/2010 | Itagaki et al. | |
| 2010/0134735 A1 | 6/2010 | Nakamura et al. | |
| 2010/0295821 A1* | 11/2010 | Chang et al. | 345/175 |
| 2011/0109591 A1 | 5/2011 | Kurokawa et al. | |
| 2013/0084665 A1 | 4/2013 | Yamazaki | |
| 2013/0207125 A1 | 8/2013 | Yamazaki et al. | |
| 2015/0226866 A1 | 8/2015 | Kimura | |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | H4-256278 | 9/1992 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2000-243975 A | 9/2000 |
| JP | 2001-292276 | 10/2001 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |

(56) References Cited

FOREIGN PATENT DOCUMENTS

| | | |
|---|---|---|
| JP | 2004-273732 | 9/2004 |
| JP | 2005-275644 | 10/2005 |
| JP | 2007-102154 | 4/2007 |
| JP | 2007-183706 | 7/2007 |
| JP | 2008-241807 A | 10/2008 |
| JP | 2008-311331 A | 12/2008 |
| JP | 2009-093154 A | 4/2009 |
| JP | 2009-128686 A | 6/2009 |
| JP | 2009-134066 A | 6/2009 |
| JP | 2009-135185 A | 6/2009 |
| JP | 2009-146100 | 7/2009 |
| JP | 2009-224479 | 10/2009 |
| TW | 418542 | 1/2001 |
| TW | 544905 | 8/2003 |
| TW | 544929 | 8/2003 |
| TW | 200519720 | 6/2005 |
| TW | 200908334 | 2/2009 |
| TW | 200926095 | 6/2009 |
| WO | WO-2004/114391 A1 | 12/2004 |
| WO | WO 2008/139859 | 11/2008 |

OTHER PUBLICATIONS

Written Opinion (Application No. PCT/JP2010/068649; PCT12885) Dated Feb. 8, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl, Phys, Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42,1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys.Lett. (Applied Physics Letters), Jun. 17, 1996, vol. 68, No. 25, pp, 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'sLargest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.O, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al, "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Eng. Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Taiwanese Office Action (Application No. 103112133) Dated Aug. 6, 2015.

* cited by examiner

DISPLAY DEVICE

TECHNICAL FIELD

The technical field of the present invention relates to a display device and a driving method thereof.

BACKGROUND ART

In recent years, a display panel provided with a touch sensor has attracted attention. Examples of the touch sensor includes a resistive touch sensor, a capacitive touch sensor, and an optical touch sensor which are different in operation principle. An object (e.g., a pen or a finger) touches a display device, whereby data can be input to the display device.

As an example of a device including such an optical touch sensor, a display device having an image capturing function, which is provided with a contact type area sensor that captures an image, is given (e.g., see Patent Document 1).

REFERENCE

[Patent Document 1] Japanese Published Patent Application No. 2001-292276

DISCLOSURE OF INVENTION

In the case of a display panel provided with the above touch sensor as an input device, the surface of the display panel continues to be touched by an object. Therefore, the display panel gets dirty easily and has a possibility that the display quality is degraded. The display panel needs to have proper mechanical strength. Further, there is a problem in that the users of the display panel tend to be tired when the surface of the display panel is hard, for example.

In view of the above problems, it is an objective to make it possible that a device detects a position and motion of an object even when the object is not in contact with a display panel.

A circuit including a transistor is provided for a display panel having a touch sensor as an input device.

When a transistor including single crystal silicon is used, the size of an area sensor is limited by the size of a single crystal silicon substrate. In other words, formation of a large area sensor or a large area sensor also serving as a display device using a single crystal silicon substrate is costly and impractical.

On the other hand, the size of a substrate can be easily increased when a thin film transistor (TFT) including amorphous silicon is employed. However, field-effect mobility of an amorphous silicon thin film is low; thus, there is a limit on a circuit design; therefore, an area occupied by a circuit is increased.

Further, thin film transistors including polycrystalline silicon are formed in many cases by employing a method with which crystallization is performed by excimer laser annealing and therefore vary in their characteristics because of excimer laser annealing. Therefore, it is difficult to generate intensity distribution of detected light into electrical signals with high reproducibility with a photosensor using circuits including thin film transistors which vary in their characteristics.

An object of an embodiment of the present invention is to provide a display panel including as an input device a touch sensor which can be mass-produced over a large substrate and has uniform and stable electric characteristics.

Another object of an embodiment of the present invention is to provide a display device including a highly-functional touch sensor capable of fast response as an input device.

A display device including a touch sensor as an input device is provided with a circuit having a transistor including an oxide semiconductor layer.

However, a difference from the stoichiometric composition in the oxide semiconductor arises in a thin film formation process. For example, electric conductivity of the oxide semiconductor changes due to the excess or deficiency of oxygen. Further, hydrogen or moisture that enters the oxide semiconductor thin film during the formation of the thin film forms an oxygen (O)-hydrogen (H) bond and serves as an electron donor, which is a factor of changing electric conductivity. Furthermore, since the O—H bond is a polar molecule, it serves as a factor of varying the characteristics of an active device such as a thin film transistor manufactured using an oxide semiconductor.

In order to prevent variation in electric characteristics of the thin film transistor including an oxide semiconductor layer, which is disclosed in this specification, impurities such as hydrogen, moisture, a hydroxyl group, or a hydride (also referred to as a hydrogen compound) which cause the variation are intentionally removed from the oxide semiconductor layer. Additionally, the oxide semiconductor layer is highly purified to become i-type (intrinsic) by supplying oxygen which is a major component of an oxide semiconductor, which is simultaneously reduced in a step of removing impurities.

Therefore, it is preferable that the oxide semiconductor contains hydrogen and carriers as little as possible. In the thin film transistor disclosed in this specification, a channel formation region is formed in the oxide semiconductor layer, in which hydrogen contained in the oxide semiconductor is set less than or equal to $5 \times 10^{19}/cm^3$, preferably, less than or equal to $5 \times 10^{18}/cm^3$, more preferably, less than or equal to $5 \times 10^{17}/cm^3$ or less than $5 \times 10^{16}/cm^3$; hydrogen contained in the oxide semiconductor is removed as much as possible to be close to 0; and the carrier concentration is less than $5 \times 10^{14}/cm^3$, preferably, less than or equal to $5 \times 10^{12}/cm^3$.

It is preferable that an off-state current be as small as possible in reverse characteristics of a thin film transistor. An off-state current (also referred to as a leakage current) is a current that flows between a source and a drain of a thin film transistor in the case where a given gate voltage between $-1$ V to $-10$ V is applied. A current value per 1 μm in a channel width (w) of a thin film transistor including an oxide semiconductor, which is disclosed in this specification, is less than or equal to 100 aA/μm, preferably, less than or equal to 10 aA/μm, more preferably, less than or equal to 1 aA/μm. Further, since there is no pn junction and no hot carrier degradation, electric characteristics of the thin film transistor is not adversely affected.

The above concentration range of hydrogen can be obtained by secondary ion mass spectrometry (SIMS) or on the basis of data of SIMS. In addition, the carrier concentration can be measured by Hall effect measurement. As an example of an equipment used for Hall effect measurement, the specific resistance/hole measuring system ResiTest 8310 (manufactured by TOYO Corporation) can be given. With the specific resistance/Hall measuring system ResiTest 8310, the direction and strength of a magnetic field are changed in a certain cycle and in synchronization therewith, only a Hall electromotive voltage caused in a sample is detected, so that AC (alternate current) Hall measurement can be performed. Even in the case of a material with low mobility and high resistivity, a Hall electromotive voltage can be detected.

As the oxide semiconductor layer used in this specification, any of a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, or a two-component metal oxide such as an In—Zn—O film, a Sn—Zn—O film, an Al—Zn—O film, a Zn—Mg—O film, a Sn—Mg—O film, and an In—Mg—O film, or a one-component metal oxide such as an In—O film, a Sn—O film, and a Zn—O film can be used. Further, $SiO_2$ may be contained in the above oxide semiconductor layer.

Note that as the oxide semiconductor layer, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor layer whose composition formula is represented by $InMO_3 (ZnO)_m$ (m>0), which includes Ga as M, is referred to as the In—Ga—Zn—O oxide semiconductor described above, and a thin film of the In—Ga—Zn—O oxide semiconductor is also referred to as an In—Ga—Zn—O-based non-single-crystal film.

According to an embodiment, a display device has a display panel where a photosensor and a thin film transistor including an oxide semiconductor layer are arranged. The display device detects a shadow projected on the display panel when the object approaches the display panel and blocks ambient light. A position or motion of the shadow is detected, whereby a position or motion of the object is detected.

According to another embodiment, a display device has a display panel where a photosensor and a thin film transistor including an oxide semiconductor layer are arranged. The display device detects light emitted from the display panel and reflected by an object with the photosensor when the object approaches the display panel. That is, when an image of a contactless object is shot by the photosensor, a position or motion of the object is detected.

Thus, even in the case where an object is not in contact with a display panel, the object can be detected.

Another embodiment is a display device having a display panel where pixels each including a photosensor and a thin film transistor including an oxide semiconductor layer are arranged in matrix; and an image processing portion. The display device has a function of detecting a contactless object. The photosensor is configured to detect a shadow of an object projected on the display panel. The image processing portion is configured to detect a position of the object on the basis of a position of the shadow of the object, and motion of the object on the basis of motion of the shadow.

Another embodiment is a display device having a display panel where pixels each including a photosensor and a thin film transistor including an oxide semiconductor layer are arranged in matrix; and an image processing portion. The display device has a function of detecting a contactless object. The photosensor is configured to detect a shadow of an object projected on the display panel. The image processing portion is configured to detect a position of the object on the basis of a position of the shadow of the object, and motion of the object on the basis of motion of the shadow. The image processing portion is configured to recognize a region including the largest number of pixels detecting the shadow among a plurality of regions obtained by dividing the display panel, as positional data of the object.

Another embodiment is a display device having a display panel where pixels each including a photosensor and a thin film transistor including an oxide semiconductor layer are arranged in matrix; and an image processing portion. The display device has a function of detecting a contactless object. The photosensor is configured to detect a shadow of an object projected on the display panel. The image processing portion is configured to detect a position of the object on the basis of a position of the shadow of the object, and motion of the object on the basis of motion of the shadow. The image processing portion is configured to recognize a region including the largest number of pixels detecting the shadow among a plurality of regions obtained by dividing the display panel, as positional data of the object. The image processing portion is configured to detect the motion of the object by comparing the successive positional data.

Another embodiment is a display device having a display panel including a photodetection portion where pixels each include a first photosensor and a first thin film transistor including an oxide semiconductor layer and an area sensor where pixels each include a second photosensor and a second thin film transistor including an oxide semiconductor layer; and an image processing portion. The display device has a function of detecting a contactless object. The first photosensor is configured to detect a shadow of an object projected on the display panel. The image processing portion is configured to detect a position of the object on the basis of a position of the shadow of the object, and motion of the object on the basis of motion of the shadow.

Another embodiment is a display device having a display panel including a photodetection portion where pixels each include a first photosensor and a first thin film transistor including an oxide semiconductor layer and an area sensor where pixels each include a second photosensor and a second thin film transistor including an oxide semiconductor layer; and an image processing portion. The display device has a function of detecting a contactless object. The first photosensor is configured to detect a shadow of an object projected on the display panel. The image processing portion is configured to detect a position of the object on the basis of a position of the shadow of the object, and motion of the object on the basis of motion of the shadow. The image processing portion is configured to recognize a region including the largest number of pixels detecting the shadow among a plurality of regions obtained by dividing the display panel, as positional data of the object.

Another embodiment is a display device having a display panel including a photodetection portion where pixels each include a first photosensor and a first thin film transistor including an oxide semiconductor layer and an area sensor where pixels each include a second photosensor and a second thin film transistor including an oxide semiconductor layer; and an image processing portion. The display device has a function of detecting a contactless object. The first photosensor is configured to detect a shadow of an object projected on the display panel. The image processing portion is configured to detect a position of the object on the basis of a position of the shadow of the object, and motion of the object on the basis of motion of the shadow. The image processing portion is configured to recognize a region including the largest number of pixels detecting the shadow among a plurality of regions obtained by dividing the display panel, as positional data of the object. The image processing portion is configured to detect the motion of the object by comparing the successive positional data.

Another embodiment is a display device having a display panel including a photodetection portion where pixels each include an infrared light sensor and a thin film transistor including an oxide semiconductor layer and an area sensor where pixels each include a visible light sensor. The photodetection portion is configured to detect light emitted from the display panel and reflected by an object when the object is not in contact with the display panel. The area sensor is configured to detect light emitted from the display panel and reflected by the object when the object is in contact with the display panel.

In the above structure, the number of the second photosensors is larger than that of the first photosensors.

In the above structure, the second photosensors are provided on the periphery of the first photosensor.

When a contactless object can be detected, the frequency at which the object touches a display panel can be reduced and thus degradation in display quality can be prevented.

With a thin film transistor including an oxide semiconductor layer, a display device including a highly-functional touch panel capable of fast response as an input device can be provided.

BEST MODE FOR CARRYING OUT THE INVENTION

Figure 1:
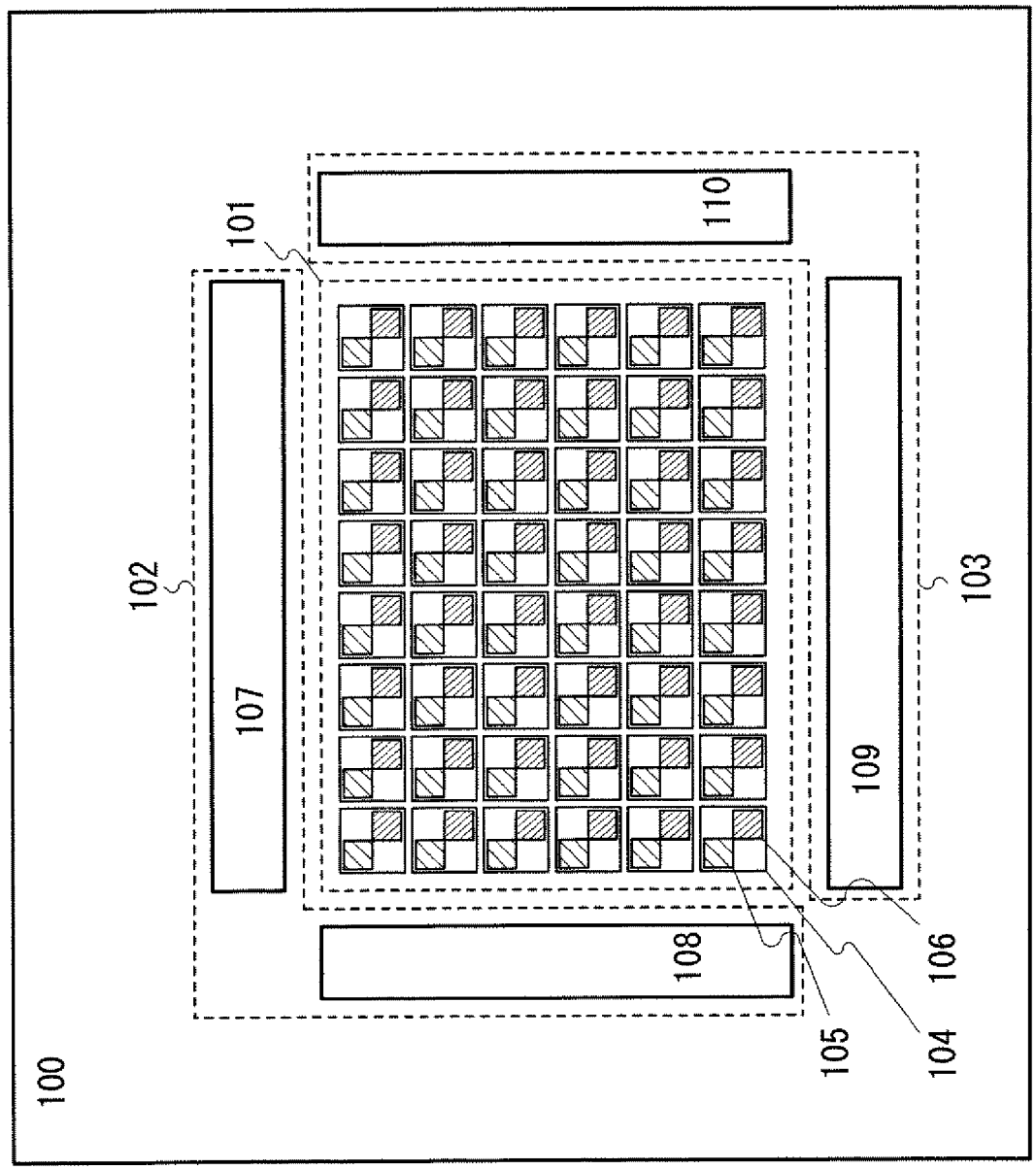
FIG. 1 illustrates a structure of a display panel.

Hereinafter, embodiments will be described in detail with reference to the accompanying drawings. However, since embodiments described below can be embodied in many different modes, it is easily understood by those skilled in the art that the mode and the detail can be variously changed without departing from the scope of the present invention. Therefore, the disclosed invention should not be interpreted as being limited to the following description of the embodiments. In the drawings for describing the embodiments, the same parts or parts having a similar function are denoted by the same reference numerals, and description of such parts is not repeated.

(Embodiment 1)

In this embodiment, a display panel will be described with reference to FIG. 1, FIG. 2, FIG. 3, FIG. 4, and FIG. 5.

A structure of the display panel will be described with reference to FIG. 1, A display panel 100 includes a pixel circuit 101, a display element control circuit 102, and a photosensor control circuit 103. The pixel circuit 101 includes a plurality of pixels 104 arranged in a matrix of rows and columns. Each of the pixels 104 includes a display element 105 and a photosensor 106.

Each of the display elements 105 includes a thin film transistor (TFT), a storage capacitor, a liquid crystal element including a liquid crystal layer, and the like. The thin film transistor has a function of controlling injection or ejection of charge to/from the storage capacitor. The storage capacitor has a function of holding charge which corresponds to voltage applied to the liquid crystal layer. Taking advantage of the change in the direction of a polarization due to a voltage application to the liquid crystal layer, tone of light passing through the liquid crystal layer is made (gray scale display is performed), so that image display is realized. Light that a light source (a backlight) emits from the rear side of a liquid crystal display device is used as the light passing through the liquid crystal layer.

Note that the case where the display elements 105 include liquid crystal elements is described; however, other elements such as light-emitting elements may be included. The light-emitting element is an element in which the luminance is controlled by current or voltage. Specifically, a light emitting diode, an EL element (organic EL element (organic light emitting diode (OLED) or an inorganic EL element), and the like are given.

The photosensors 106 each include an element such as a photodiode, which has a function of generating an electrical signal when receiving light, and a thin film transistor. Note that as light which is received by the photosensors 106, ambient light is used in the case where image shooting data of a shadow of an object is detected, whereas reflected light obtained when light from a backlight is delivered to an object is used in the case where image shooting data of the object itself is detected.

The display element control circuit 102 controls the display elements 105 and includes a display element driver circuit 107 and a display element driver circuit 108. The display element driver circuit 107 inputs a signal to the display elements 105 through signal lines (also referred to as "source signal lines") such as video data signal lines. The display element driver circuit 108 inputs a signal to the display elements 105 through scan lines (also referred to as "gate signal lines"). For example, the display element driver circuit 108 for driving the scan lines has a function of selecting display elements 105 included in the pixels placed in a particular row. Further, the display element driver circuit 107 for driving the signal lines has a function of giving a predetermined potential to the display elements 105 included in the pixels placed in the selected row. Note that in the display elements to which the display element driver circuit 108 for driving the scan lines gives a high potential, the thin film transistors are brought into conduction and charges given by the display element driver circuit 107 for driving the signal lines are supplied to the display elements.

The photosensor control circuit 103 controls the photosensor 106 and includes a photosensor readout circuit 109 connected to a photosensor output signal line and a photosensor reference signal line, and a photosensor driver circuit 110. The photosensor driver circuit 110 has a function of performing reset operation and selecting operation on the photosensors 106 included in the pixels placed in a particular row, which are described below. Further, the photosensor readout circuit 109 has a function of taking out output signals of the photosensors 106 included in the pixels in the selected row. Note that the photosensor readout circuit 109 may have a configuration in which an output, which is an analog signal, of the photosensor is extracted as an analog signal to the outside of the display panel by an OP amplifier; or a configuration in which the output is converted into a digital signal by an A/D converter circuit and then extracted to the outside of the display panel.

The display panel 100 including a photosensor is provided with a circuit having a transistor including an oxide semiconductor layer.

In order to prevent variation in electric characteristics of the thin film transistor including an oxide semiconductor layer, which is included in the display panel 100 including a photosensor, impurities such as hydrogen, moisture, a hydroxyl group, or a hydride (also referred to as a hydrogen compound) which cause the variation are intentionally removed from the oxide semiconductor layer. Additionally, the oxide semiconductor layer is highly purified to become i-type (intrinsic) by supplying oxygen which is a major component of an oxide semiconductor, which is simultaneously reduced in a step of removing impurities.

Therefore, it is preferable that the oxide semiconductor contains hydrogen and carriers as little as possible. In the thin film transistor disclosed in this specification, a channel formation region is formed in the oxide semiconductor layer, in which hydrogen contained in the oxide semiconductor is set less than or equal to $5\times10^{19}/cm^3$, preferably, less than or equal to $5\times10^{18}/cm^3$, more preferably, less than or equal to $5\times10^{17}/cm^3$ or less than $5\times10^{16}/cm^3$; hydrogen contained in the oxide semiconductor is removed as much as possible to be close to 0; and the carrier concentration is less than $5\times10^{14}/cm^3$, preferably, less than or equal to $5\times10^{12}/cm^3$ It is preferable that an off-state current be as small as possible in reverse characteristics of a thin film transistor. An off-state current is a current that flows between a source and a drain of a thin film transistor in the case where a given gate voltage between −1 V to −10 V is applied. A current value per 1 μm in a channel width (w) of a thin film transistor including an oxide semiconductor, which is disclosed in this specification, is less than or equal to 100 aA/μm, preferably, less than or equal to 10 aA/μm, more preferably, less than or equal to 1 aA/μm. Further, since there is no pn junction and no hot carrier degradation, electric characteristics of the thin film transistor is not adversely affected.

Figure 2:
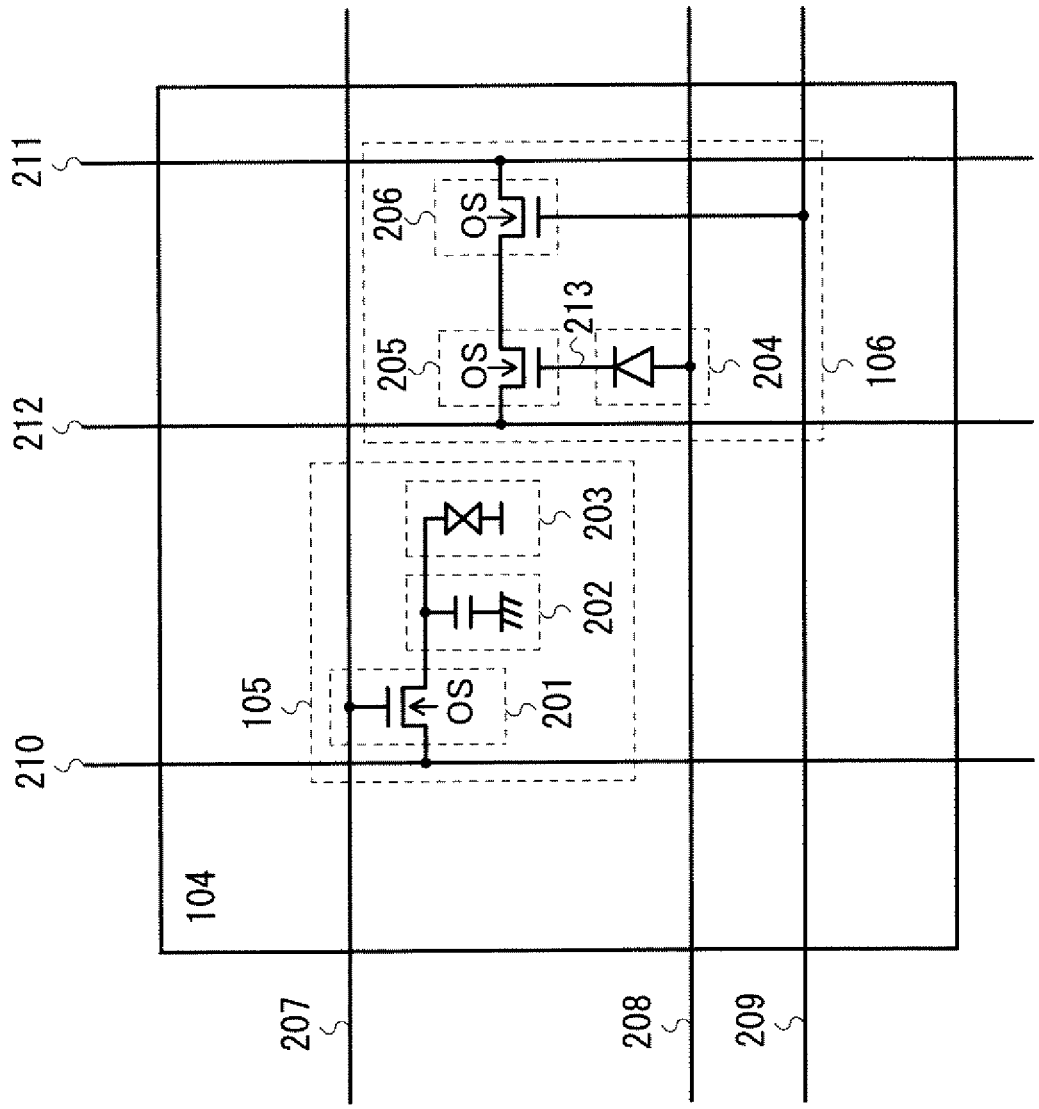
FIG. 2 illustrates a structure of a display panel.

A circuit diagram of the pixel 104 will be described with reference to FIG. 2. The pixel 104 includes the display element 105 including a transistor 201, a storage capacitor 202, and a liquid crystal element 203; and the photosensor 106 including a photodiode 204, a transistor 205, and a transistor 206. In FIG. 2, the transistor 201, the transistor 205, and the transistor 206 are each a thin film transistor including an oxide semiconductor layer.

A gate of the transistor 201 is electrically connected to a gate signal line 207, one of a source and a drain of the transistor 201 is electrically connected to a video data signal line 210, and the other of the source and the drain of the transistor 201 is electrically connected to one electrode of the storage capacitor 202 and one electrode of the liquid crystal element 203. The other electrode of the storage capacitor 202 and the other electrode of the liquid crystal element 203 are each held at a certain potential. The liquid crystal element 203 is an element including a pair of electrodes and a liquid crystal layer interposed between the pair of electrodes.

When a potential at a high level "H" is applied to the gate signal line 207, the transistor 201 applies the potential of the video data signal line 210 to the storage capacitor 202 and the liquid crystal element 203. The storage capacitor 202 holds the applied potential. The liquid crystal element 203 changes light transmittance in accordance with the applied potential.

Since the off-state currents of the transistors 201, 205, and 206 which are each a thin film transistor including an oxide semiconductor layer are extremely small, a storage capacitor can be extremely small or is not necessarily provided.

One electrode of the photodiode 204 is electrically connected to a photodiode reset signal line 208, and the other electrode of the photodiode 204 is electrically connected to a gate of the transistor 205. One of a source and a drain of the transistor 205 is electrically connected to a photosensor reference signal line 212, and the other of the source and the drain of the transistor 205 is electrically connected to one of a source and a drain of the transistor 206. A gate of the transistor 206 is electrically connected to a gate signal line 209, and the other of the source and the drain of the transistor 206 is electrically connected to a photosensor output signal line 211.

Figure 3:
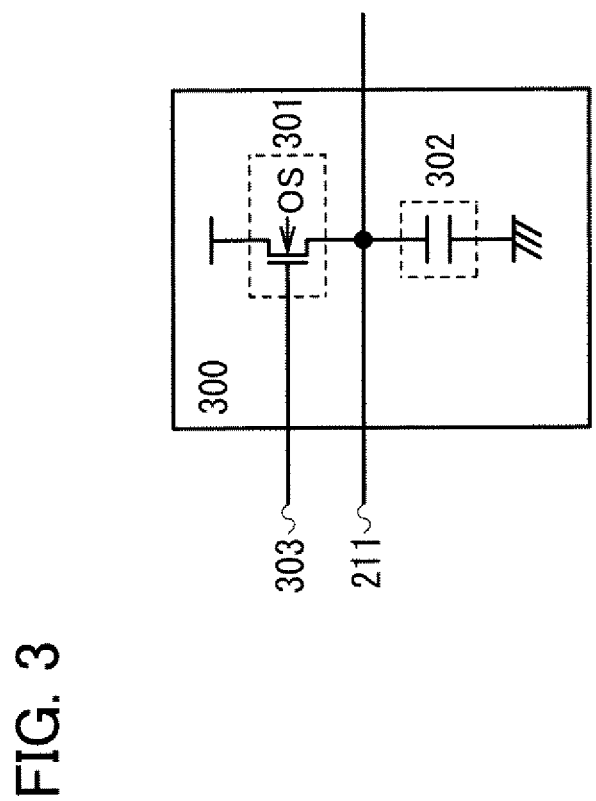
FIG. 3 illustrates a structure of a display panel.

Next, a configuration of the photosensor readout circuit 109 will be described with reference to FIG. 3. In FIG. 3, a photosensor readout circuit 300 of one column of the pixels includes a transistor 301 and a storage capacitor 302. In addition, the photosensor output signal line 211 of the column of pixels and a precharge signal line 303 are provided.

Note that in the circuit configurations in this specification, a thin film transistors including an oxide semiconductor layer are each denoted by a symbol "OS" so that they can be identified as a thin film transistors including an oxide semiconductor layer. In FIG. 2, the transistor 201, the transistor 205, and the transistor 206 are each a thin film transistor including an oxide semiconductor layer. In FIG. 3, the transistor 301 is a thin film transistor including an oxide semiconductor layer.

In the circuit 300, the potential of the photosensor output signal line 211 is set to a reference potential before operation of the photosensor in the pixel. The reference potential set for the photosensor output signal line 211 may be a high potential or a low potential. In FIG. 3, by setting a potential of the precharge signal line 303 at a high level "H", the potential of the photosensor output signal line 211 can be set to a high potential which is a reference potential. Note that the storage capacitor 302 is not necessarily provided in the case where the parasitic capacitance of the photosensor output signal line 211 is large.

Figure 4:
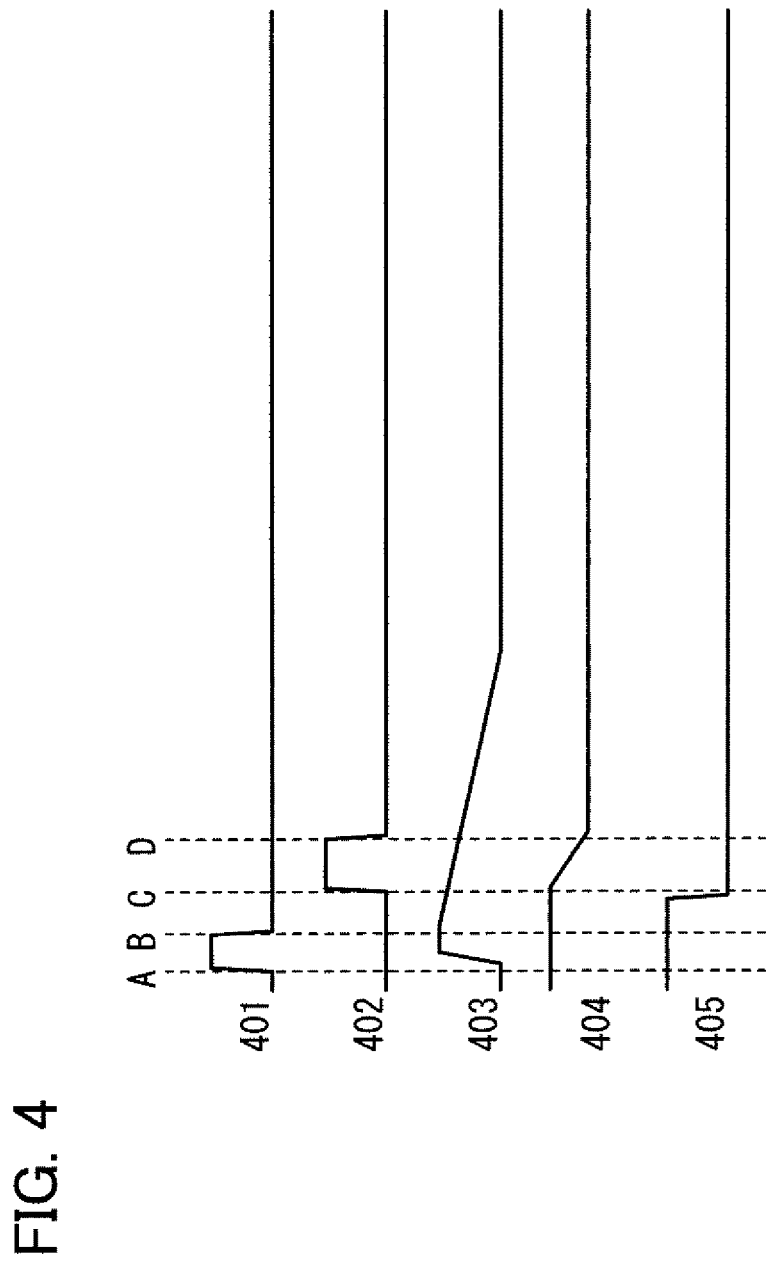
FIG. 4 is a timing chart.

Next, readout operation of the photosensor in the display panel is described with reference to a timing chart of FIG. 4. In FIG. 4, a signal 401, a signal 402, a signal 403, and a signal 404 respectively correspond to the potential of the photodiode reset signal line 208, the potential of the gate signal line 209 to which the gate of the transistor 206 is connected, the potential of the gate signal line 213 to which the gate of the transistor 205 is connected, and the potential of the photosensor output signal line 211 in FIG. 2. In addition, a signal 405 corresponds to the potential of the precharge signal line 303 in FIG. 3.

In a time A, when the potential of the photodiode reset signal line 208 (the signal 401) is set at the potential "H", in other words, the potential of the photodiode reset signal line which is electrically connected to the photodiode is set so that a forward bias is applied to the photodiode (reset operation), the photodiode 204 is brought into conduction and the potential of the gate signal line 213 (the signal 403) to which the gate of the transistor 205 is connected is set at the potential "H". In addition, when the potential of the precharge signal line 303 (the signal 405) is set at the potential "H", the potential of the photosensor output signal line 211 (the signal 404) is precharged to the potential "H".

In a time B, when the potential of the photodiode reset signal line 208 (the signal 401) is set at the potential "L" (accumulating operation), the potential of the gate signal line 213 to which the gate of the transistor 205 is connected (the signal 403) begins to be lowered due to an off current of the photodiode 204. The off current of the photodiode 204 increases when light is delivered; therefore, the potential of the gate signal line 213 to which the gate of the transistor 205 is connected (the signal 403) varies depending on the amount of delivered light. That is, a current between the source and the drain of the transistor 205 varies.

In a time C, when the potential of the gate signal line 209 (the signal 402) is set at the potential "H" (selecting operation), the transistor 206 is brought into conduction and the photosensor reference signal line 212 and the photosensor output signal line 211 are brought into conduction through the transistor 205 and the transistor 206. Then, the potential of the photosensor output signal line 211 (the signal 404) begins to be lowered. Note that before the time C, the potential of the precharge signal line 303 (the signal 405) is set at the potential "L" and precharge of the photosensor output signal line 211 is completed. Here, the rate at which the potential of the photosensor output signal line 211 (the signal 404) is lowered depends on the current between the source and the drain of the transistor 205. That is, the potential of the photosensor output signal line 211 (the signal 404) varies in accordance with the amount of light which is delivered to the photodiode 204.

In a time D, when the potential of the gate signal line 209 (the signal 402) is set at the potential "L", the transistor 206 is turned off, whereby the potential of the photosensor output signal line 211 (the signal 404) is kept at a fixed value after the time D. Here, the value to be the fixed value varies in accordance with the amount of light which is delivered to the photodiode 204. Therefore, the amount of light which is delivered to the photodiode 204 can be found by obtaining the potential of the photosensor output signal line 211.

Based on the amount of light emitted to the photodiode 204 as described above, it can be determined whether ambient light is incident on the photodiode 204 or a contactless object prevents ambient light from being incident on the photodiode 204, that is, the portion where ambient light is blocked is a shadow.

Figure 22:
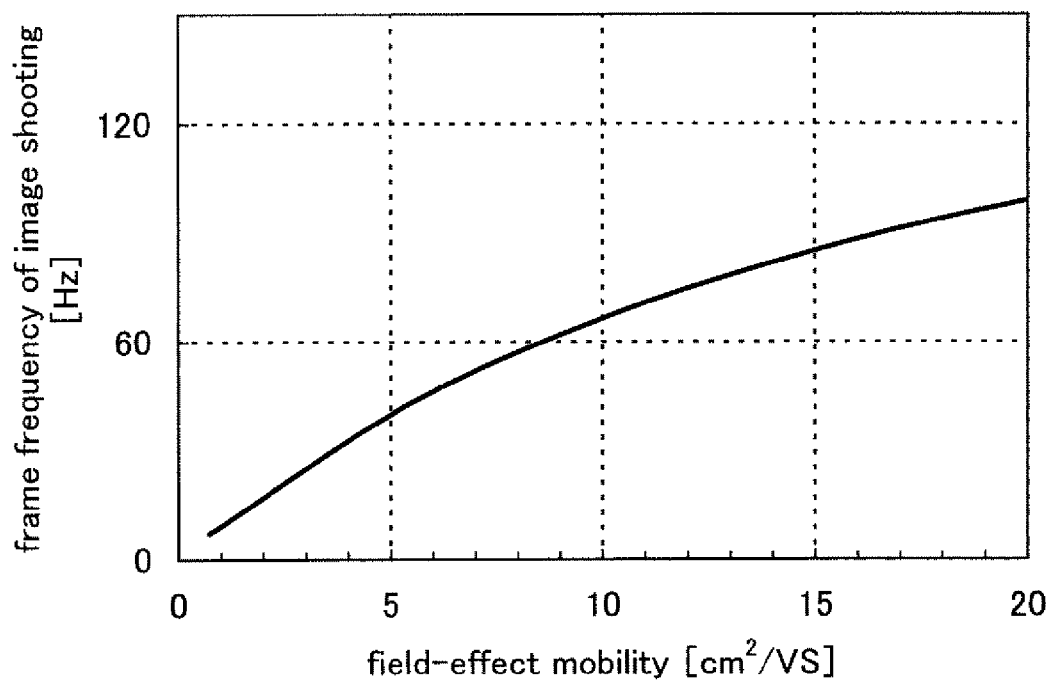
FIG. 22 is a graph showing a relationship between field-effect mobility of a transistor and a frame frequency of image shooting, which is obtained by calculation.

The results of circuit calculation of a frequency of image shooting in the photosensor 106 of FIG. 2 are shown in FIG. 22. FIG. 22 shows a relationship between field-effect mobility of the transistor 205 and the transistor 206 which are included in the photosensor 106 and a frame frequency of image shooting which is calculated from a reading speed.

The circuit calculation was performed with the following conditions assumed. In a touch panel, which has a 20-inch FHD standard (1920 horizontal RGB pixels and 1080 vertical pixels), each pixel is provided with a photosensor, the parasitic capacitance of the photosensor output signal line 211 is 20 pF (corresponds to the capacitor 302), the transistor 205 and the transistor 206 each have a channel length of 5 μm and a channel width of 16 μm, and the transistor 301 has a channel length of 5 μm and a channel width of 1000 μm. Note that a circuit simulator, Smart Spice (manufactured by Silvaco Data Systems Inc.), is used for the calculation.

The circuit calculation was performed with the following operations assumed. First, an initial state is to be a state immediately after the accumulating operation. Specifically, the potential of the gate signal line 213 is set at 8 V, the potential of the gate signal line 209 is set at 0 V, the potential of the photosensor output signal line 211 is set at 8 V, the potential of the photosensor reference signal line 212 is set at 8 V, and the potential of the precharge signal line 303 is set at 0 V. After the potential of the precharge signal line 303 and the potential of the photosensor output signal line 211 are changed to 8 V and 0 V (precharged state) respectively, the potential of the precharge signal line 303 and the potential of the gate signal line 209 are changed to 0 V and 8 V, respectively. In other words, the selecting operation is started. Note that the reference voltage is set at 0 V. After that, a final state is to be the time when the potential of the photosensor output signal line 211 is changed to 2 V, that is, the potential is changed by 2 V from the potential at the precharge operation. The time from the initial state to the final state in the operations described above is to be time for image shooting per one row.

The time needed for image shooting is to be 1080 times as much as the above time for image shooting per one row, and the inverse of the time for image shooting is to be a frequency of the image shooting. As an example, the frequency of image shooting of 60 Hz means that the above time for image shooting per one row corresponds to the following equation: 1/60 [Hz]/1080 [columns]=15.43 [μs].

According to the results in FIG. 22, it is found that the frequency of image shooting is 70 Hz to 100 Hz in the case where the field-effect mobility of each of the transistor 205 and the transistor 206 is set at 10 cm$^2$/Vs to 20 μm$^2$/Vs on the assumption that a transistor including an oxide semiconductor is used. On the other hand, in the case where the field-effect mobility of each of the transistor 205 and the transistor 206 is set at 0.5 cm$^2$/Vs on the assumption that a transistor including amorphous silicon is used, the frequency of image shooting is only about 5 Hz. In other words, a transistor which is included in a photosensor is effectively formed with a transistor including an oxide semiconductor.

Figure 5:
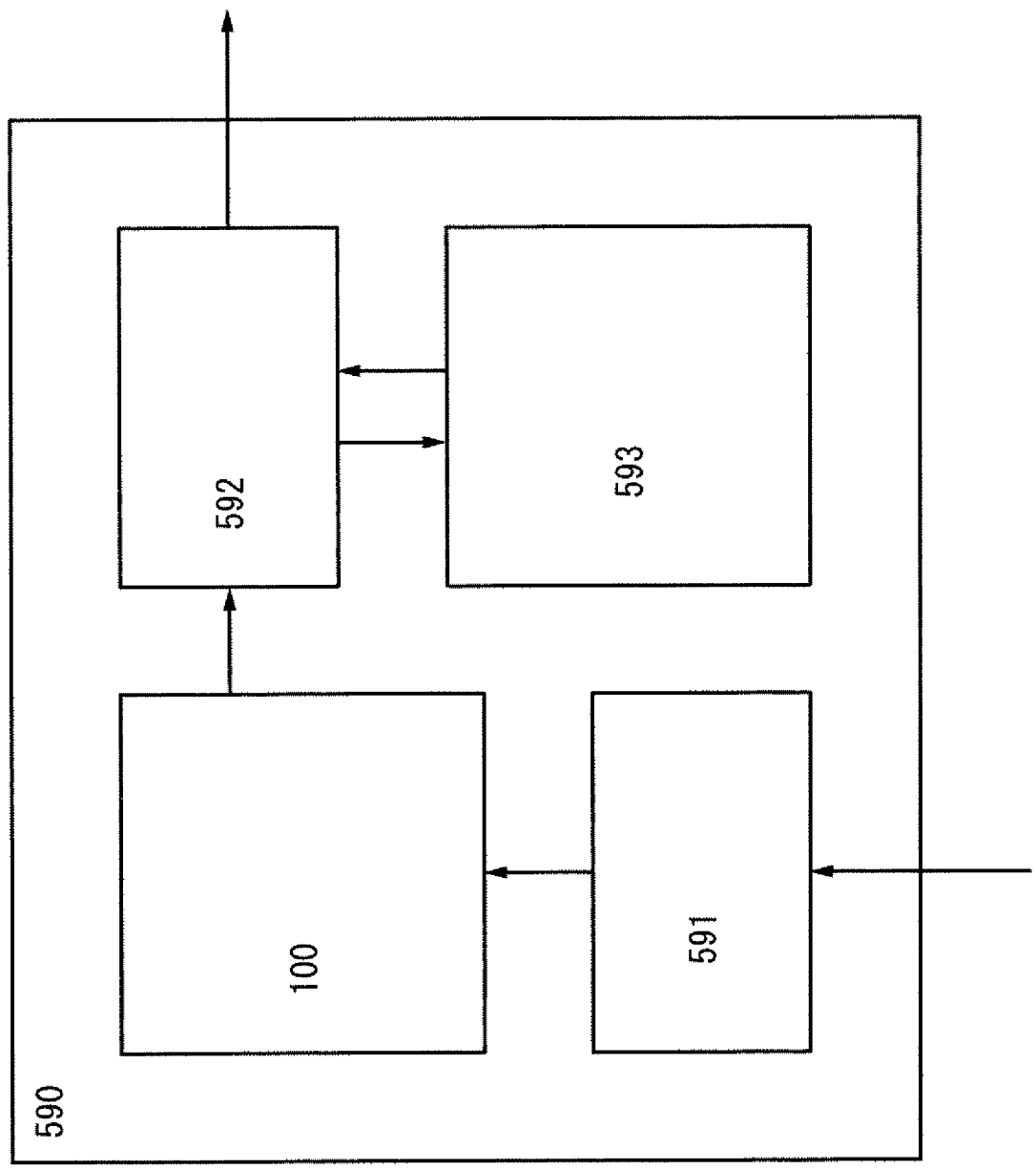
FIG. 5 illustrates a structure of a display panel.

FIG. 5 illustrates a display panel system 590 which detects motion of a contactless object, using a shadow of the object. Here, the display panel system 590 includes a display panel 100, a control circuit 591, an image processing circuit 592, a memory device 593 which stores image data. The control circuit 591 generates various timing signals for driving the display panel. The image processing circuit 592 performs arithmetic processing on the image data of the shadow of the contactless object, which is obtained by a photosensor, and detects motion of the shadow of the object. Furthermore, the image processing circuit 592 stores image data needed in the subsequent image processing in the memory device 593, and reads the data stored in the memory device 593 and performs arithmetic processing thereon if needed.

Figure 10:
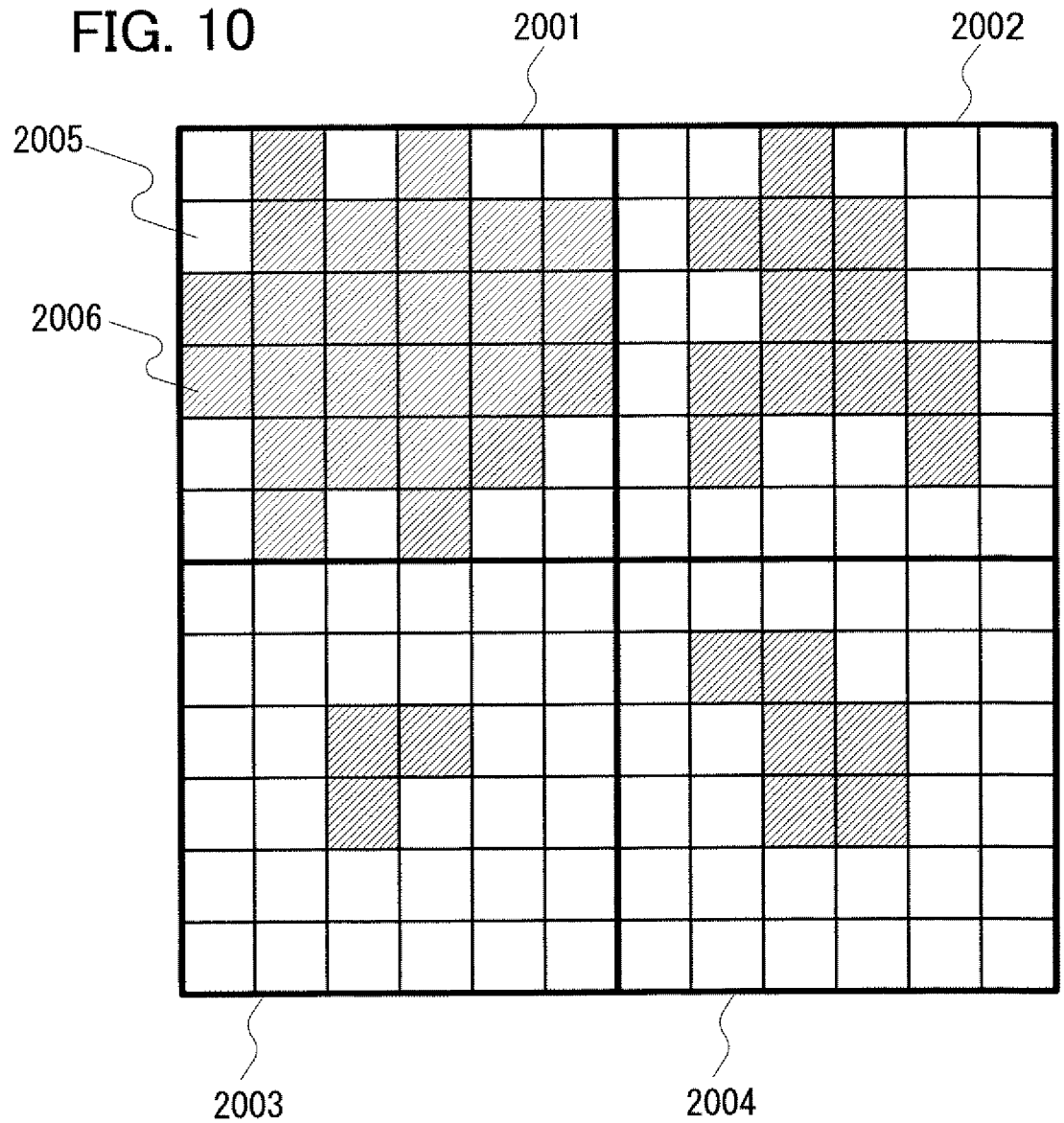
FIG. 10 illustrates an image processing.

An example of a specific method of image processing performed by the image processing circuit 592 will be described with reference to FIG. 10. In FIG. 10, a display region including 12×12 pixels is illustrated.

The image processing is performed as follows: (1) a position of an object is extracted from the image data of the shadow of the object; (2) motion of the object is detected from positional data of the object which are successively captured;

(3) generation of input data in response to the motion of the object is performed; and the like.

As for (1) extraction of a position of an object from the image data of the shadow of the object, the display region is divided into four areas: an area 2001, an area 2002, an area 2003, and an area 2004, for example, as frames are marked with thick lines in FIG. 10. In each area, a ratio of portions recognized as a shadow of the object to the area is calculated. More specifically, when the amount of light obtained by the photosensor in each pixel is lower than a given threshold value, the pixel detects a shadow of the object. Note that a pixel not detecting a shadow is denoted by a reference numeral 2005 and a pixel detecting a shadow is denoted by a reference numeral 2006.

Then, an area in which a ratio of the pixels over which the shadow is cast to all of the pixels is the highest of the areas 2001 to 2004 is extracted as a position of the object. In FIG. 10, the pixels detecting the shadow are marked with diagonal lines. The ratio of the pixels detecting the shadow in each area is as follows: in the area 2001, the ratio is 25/36; the area 2002, 12/36; the area 2003, 3/36; and the area 2004, 6/36. The ratio of the pixels over which the shadow is cast is the highest in the area 2001; therefore, the area 2001 is extracted as a position of the object and the positional data thereof is obtained.

Note that the display region is divided into more areas, whereby the position can be extracted more precisely.

Next, (2) detection of motion of the object from positional data of the object which are successively captured will be described more specifically: the positional data are successively obtained as described above, and then the positional data is compared with the positional data captured before and after the positional data is captured, whereby the motion of the object can be known. For example, when the last positional data is the right and the positional data of this time is the left, the object can be detected to move from right to left. Moreover, in the case where the positional data is extracted more precisely, the more precise motion such as the motion speed in addition to the direction in which the object moves can be detected.

As for (3) generation of input data in response to the motion of the object, it is effective to preliminarily set the input data in flexible response to the motion of the object depending on the usage of the display panel. For example, the following application is possible: given that an object is a finger, when the finger moves from left to right, a moving image is reproduced and when the finger moves from top to bottom, a moving image is stopped. Moreover, it is also effective to suppose a letter from an elaborate motion of a finger to determine it as input data.

It is also effective that the sensitivity of the photosensor with respect to the amount of light is variable. In a structure in FIG. 2, for example, the potential applied to the photosensor (the potential of the photodiode reset signal line 208, the potential of the gate signal line 209, the potential of the photosensor reference signal line 212, or the potential of the precharge signal line 303) varies, so that the sensitivity to the amount of light is variable. Thus, when the sensitivity of the photosensor with respect to the amount of light is variable, the sensitivity can be set at an optimal value as appropriate depending on the environment (the brightness or the like) where the display panel is used and a shadow of a contactless object can easily be recognized. Moreover, the display panel can be used not only for detecting a shadow of a contactless object but also as a contact area sensor. That is to say, a function of detecting a contactless object and a function of detecting a touch object can be used as appropriate depending on the usage.

With the above structure, a display panel capable of detecting even a contactless object and inputting data can be provided.

Furthermore, the above image processing can be applied to the case of detecting light reflected by an object in addition to the case of detecting a shadow of the object. In the case of detecting reflection light, photosensors placed at a position toward which an object moves receive stronger light than those at the other positions. That is, an area, in the display region, which receives stronger light, is specified using the above image processing, whereby the position, the motion, or the shape of the object can be detected. In this case, the pixels which are marked with diagonal lines in FIG. 10 receive stronger light reflected by the object.

Additionally, it is effective that a first photosensor which detects a contactless object and a second photosensor which detects a touch object are provided in the display panel. The second photosensor is used as the contact area sensor. With such a structure, a display panel capable of detecting a contactless object and capable of detecting also a touch object can be provided. That is, two types of detection functions can be used as appropriate depending on the usage of the display panel.

Pixels each including the first photosensor and pixels each including the second photosensor are arranged in matrix on the display panel. It is desirable that the number of second photosensors is larger than the number of first photosensors. The second photosensor serving as a contact area sensor is required to shoot a high resolution image; therefore, a distance (pitch) between the second photosensors is short, whereby the resolution can be high. On the other hand, the first photosensor detecting a shadow only need to determine the position of the object; therefore, the first photosensor is not required to have as high resolution as the second photosensor used as a contact area sensor. That is, the distance between the arranged second photosensors may be shorter than the distance between the arranged first photosensors.

Note that pixels in each of which the first photosensor detecting a shadow is provided are pixels in each of which the second photosensor used as a contact area sensor is not provided. Therefore, photosensors serving as contact area sensors are desirably provided in about one to three pixels around photosensor detecting a shadow so that a lost image in the pixels can be restored by image processing.

Figure 11A:
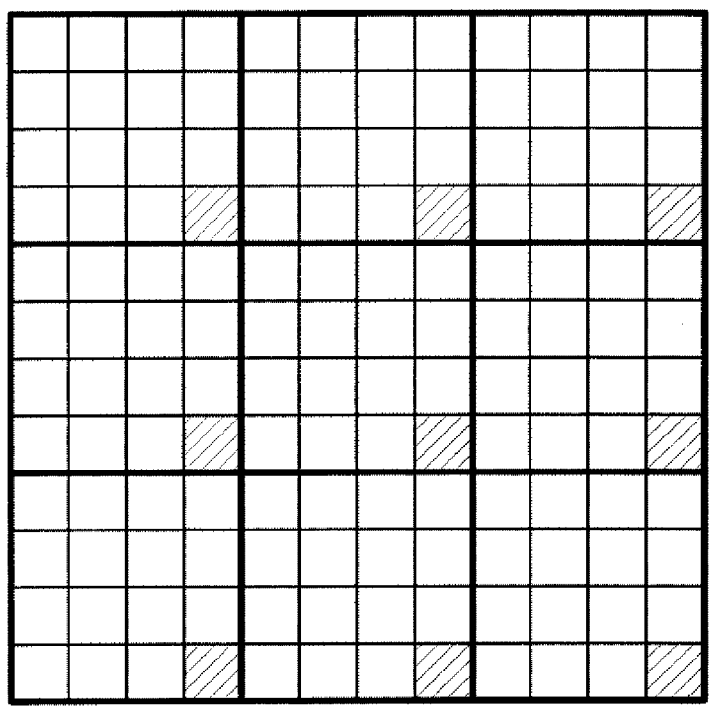
FIGS. 11A and 11B illustrate an image processing.
Figure 11B:
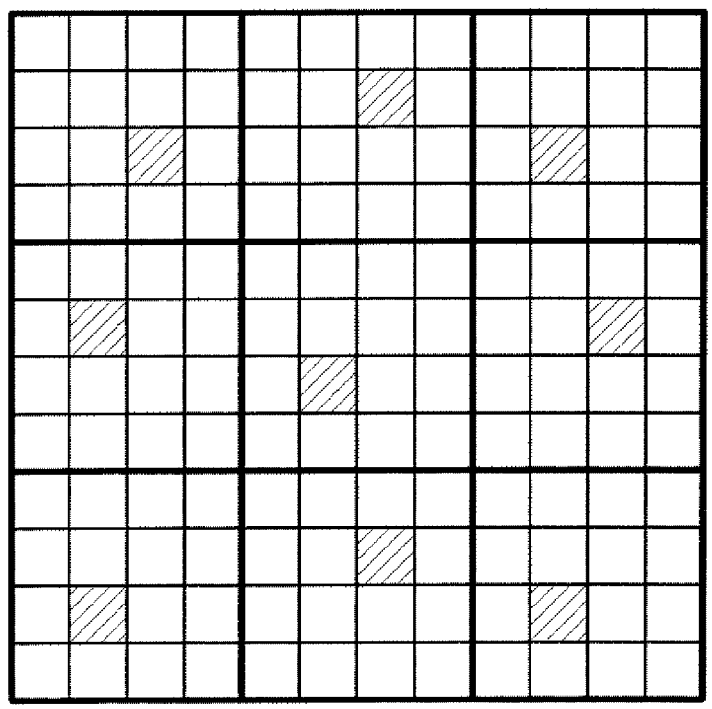

FIG. 11A illustrates an example of pixels where the first photosensors detecting a shadow and the second photosensors used as a contact area sensor are arranged. In FIGS. 11A and 11B, 12×12 pixels are used; however, the number of pixels is not limited to this.

In FIG. 11A, the first photosensors are provided in pixels marked with diagonal lines, and the second photosensors are provided in the other pixels. The first photosensors are arranged at intervals. For the above reason, the number of second photosensors is larger than that of first photosensors.

Note that the first photosensors are not necessarily arranged at regular intervals as illustrated in FIG. 11A, and may be arranged at irregular intervals as illustrated in FIG. 11B. In the case where 640×480 pixels are used as a more practical example, when the pixels are divided into areas including hundred pixels of 10×10 pixels, a pixel of the hundred pixels is provided with the first photosensor and the ninety-nine pixels are provided with the second photosensors, which is effective enough for the device to detect a shadow of the object and to serve as a contact area sensor. However, the structure is not limited to this. The ratio of the first photosensors to the second photosensors may be determined in accordance with the detection accuracy. The number of the first photosensors and the number of the second photosensors can be equal to each other, for example.

Note that, in the photosensor detecting a shadow and the photosensor used as a contact area sensor, it is effective to individually set a potential to be applied to each of the photosensors (e.g., the potential of the photodiode reset signal line 208, the potential of the gate signal line 209, the potential of the photosensor reference signal line 212, or the potential of the precharge signal line 303 in FIG. 2 or FIG. 3). Moreover, it is effective that the sizes of photodiodes included in the photosensors or the circuit configurations of the photosensors vary from one photosensor to another.

This embodiment can be implemented in appropriate combination with any of the other embodiments and examples.

(Embodiment 2)

In this embodiment, a method for increasing detection accuracy of a photosensor in the case of using light reflected by an object will be described.

For detection of a contactless object, slight light reflected by the object needs to be effectively detected. Specifically, the following method is given.

A structure is employed in which a sensor which detects infrared light (an infrared light sensor) is used as a photosensor and the infrared light sensor detects infrared light emitted from a touch panel and reflected by an object. The infrared light sensor can be formed, for example, by being provided with a stack of color filters of different colors (e.g., R (red) and B (blue), or R (red) and G (green)) on a photosensor so that light (infrared light) other than visible light can be incident on the photosensor. By using color filters provided on a display panel for color display also as filters of the infrared light sensor, the number of steps can be reduced. Moreover, for example, a light source emitting infrared light in addition to visible light (white) is added to a backlight, whereby the touch panel can emit infrared light. As for infrared light, the wavelength is longer and the amount of scattering is smaller than visible light; therefore, the detection accuracy can be easily increased. The structure of detecting infrared light is effective, particularly in the case where the object is a finger or a hand.

When an infrared light sensor and a visible light sensor are formed using different materials, the infrared light sensor may be formed using a material which absorbs light (infrared light) other than visible light. For example, a photosensor formed using InGaAs, PbS, PbSe, or the like absorbs infrared light efficiently.

In the structure described in Embodiment 1 where the first photosensor detecting a contactless object and the second photosensor detecting a touch object are provided in the display panel, an infrared light sensor is used for the first photosensor and a visible light sensor is used for the second photosensor. Accordingly, the accuracy of both a function of detecting a contactless object and a function as a contact area sensor can be improved. The first photosensors (the infrared light sensors) and the second photosensors (the visible light sensors) can be arranged in a manner similar to that of Embodiment 1.

Moreover, the image processing described in Embodiment 1 can be adopted.

This embodiment can be implemented in appropriate combination with any of the other embodiments and examples.

(Embodiment 3)

In this embodiment, a structure of a display device according to an embodiment of the present invention will be described with reference to FIG. 6.

Figure 6:
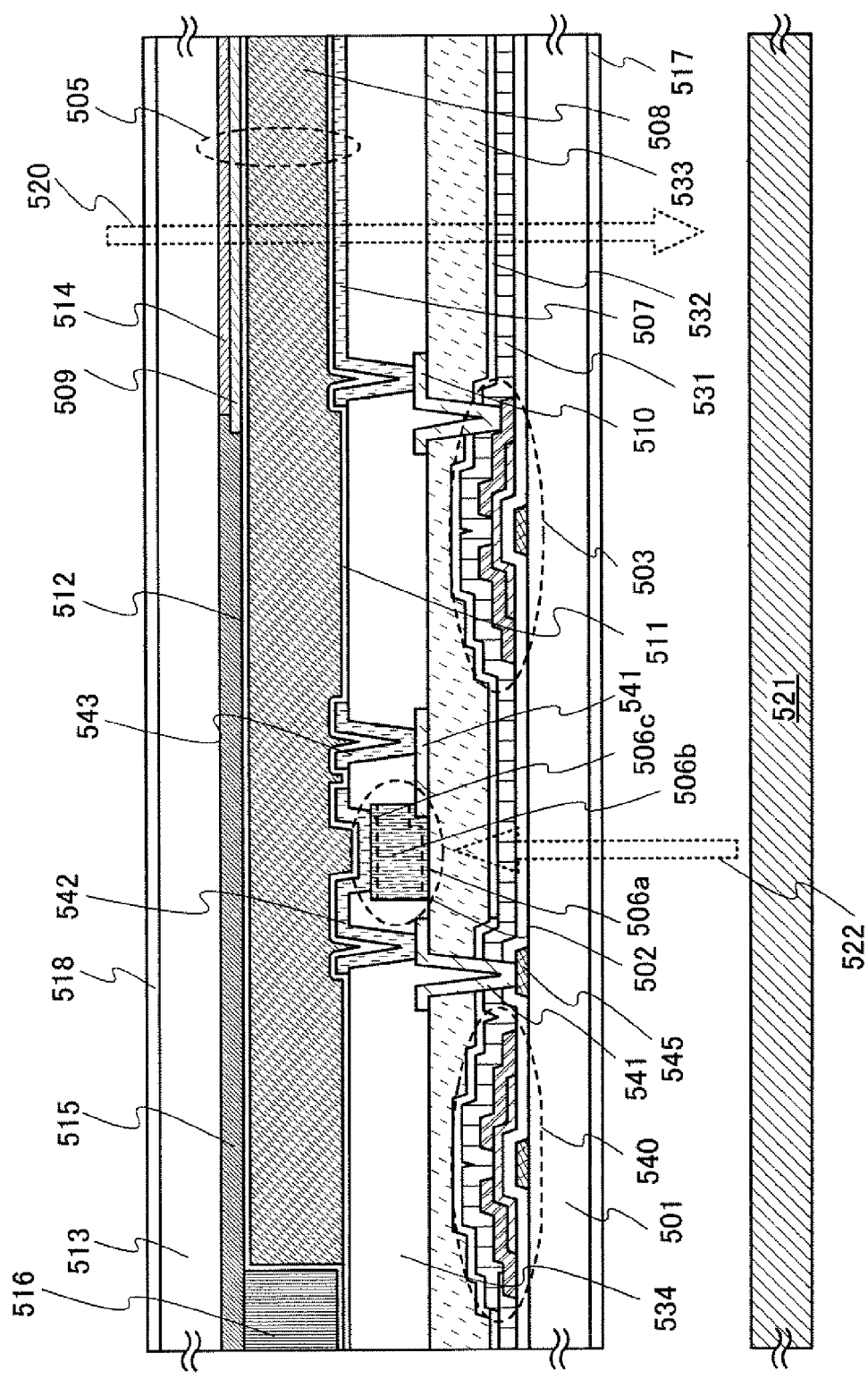
FIG. 6 is a cross-sectional view of a display panel.

FIG. 6 illustrates an example of a cross-sectional view of the display device. In the display device illustrated in FIG. 6, a photodiode 502, a transistor 540, a transistor 503, and a liquid crystal element 505 are formed over a substrate 501 having an insulating surface (a TFT substrate).

An oxide insulating layer 531, a protective insulating layer 532, an interlayer insulating layer 533, and an interlayer insulating layer 534 are provided over the transistor 503 and the transistor 540. The photodiode 502 is provided over the interlayer insulating layer 533. In the photodiode 502, a first semiconductor layer 506a, a second semiconductor layer 506b, and a third semiconductor layer 506c are sacked in that order over the interlayer insulating layer 533 between an electrode layer 541 formed over the interlayer insulating layer 533 and an electrode layer 542 formed over the interlayer insulating layer 534.

The electrode layer 541 is electrically connected to a conductive layer 543 which is formed in the interlayer insulating layer 534, and the electrode layer 542 is electrically connected to a gate electrode layer 545 through the electrode layer 541. The gate electrode layer 545 is electrically connected to a gate electrode layer of the transistor 540, and the photodiode 502 is electrically connected to the transistor 540. The transistor 540 corresponds to the transistor 205 in Embodiment 1.

In order to prevent variation in electric characteristics of the transistor 503 and the transistor 540 each formed using an oxide semiconductor layer, which are included in a touch panel including a photosensor, impurities such as hydrogen, moisture, hydroxyl group, or a hydride (also referred to as a hydrogen compound) which cause the variation are intentionally removed from the oxide semiconductor layer. Additionally, the oxide semiconductor layer is highly purified to become i-type (intrinsic) by supplying oxygen which is a major component of the oxide semiconductor layer, which is simultaneously reduced in a step of removing impurities.

Therefore, it is preferable that the oxide semiconductor layer contains hydrogen and carriers as little as possible. In the transistor 503 and the transistor 540, a channel formation region is formed in the oxide semiconductor layer, in which hydrogen contained therein is removed as much as possible to be close to 0 so that the hydrogen concentration is less than or equal to $5\times10^{19}/cm^3$, preferably, less than or equal to $5\times10^{18}/cm^3$, more preferably, less than or equal to $5\times10^{17}/cm^3$ or less than $5\times10^{16}/cm^3$, and the carrier concentration is less than $5\times10^{14}/cm^3$, preferably, less than or equal to $5\times10^{12}/cm^3$.

It is preferable that an off-state current be as small as possible in reverse characteristics of the transistor 503 and the transistor 540. An off state current is a current that flows between a source and a drain of a thin film transistor in the case where a gate voltage between −1 V to −10 V is applied. A current value per 1 μm in a channel width (w) of a thin film transistor formed using an oxide semiconductor, which is disclosed in this specification, is less than or equal to 100 aA/μm, preferably, less than or equal to 10 aA/μm, more preferably, less than or equal to 1 aA/μm. Further, since there is no pn junction and no hot carrier degradation, electric characteristics of the thin film transistor is not adversely affected.

Figure 18:
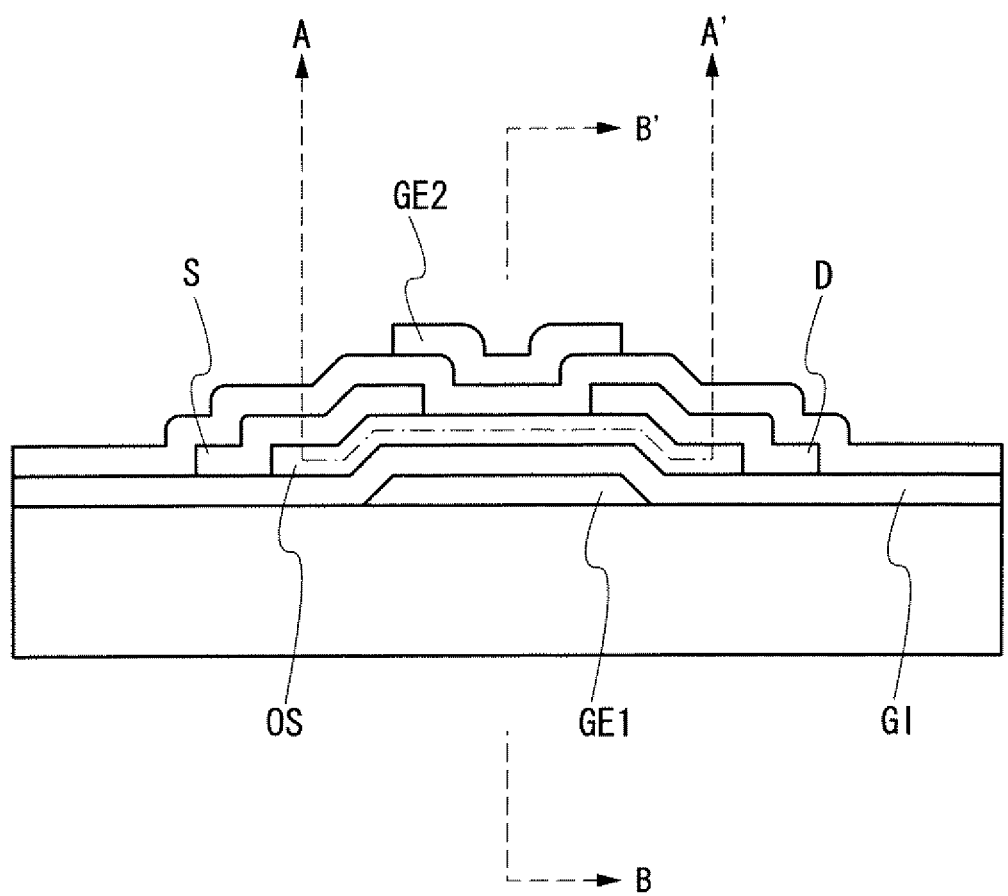
FIG. 18 is a longitudinal cross-sectional view of an inverted staggered thin film transistor including an oxide semiconductor.

FIG. 18 is a longitudinal cross-sectional view of an inverted staggered thin film transistor formed using an oxide semiconductor. An oxide semiconductor layer (OS) is provided over a gate electrode (GE1) with a gate insulating film (GI) interposed therebetween, and a source electrode (S) and a drain electrode (D) are provided thereover.

Figure 19A:
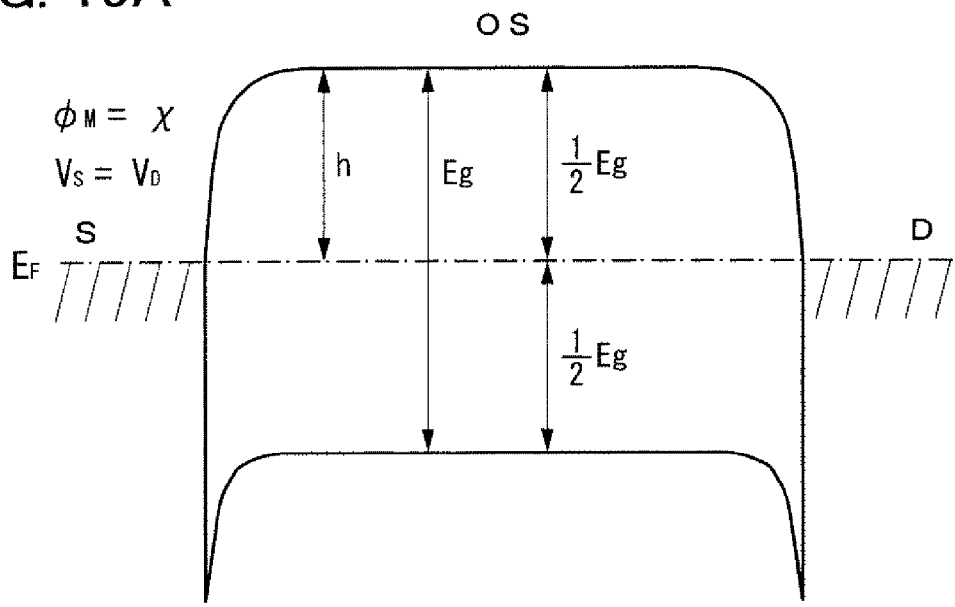
FIG. 19A is an energy band diagram (schematic diagram) of a cross section along A-A' in FIG. 18.
Figure 19B:
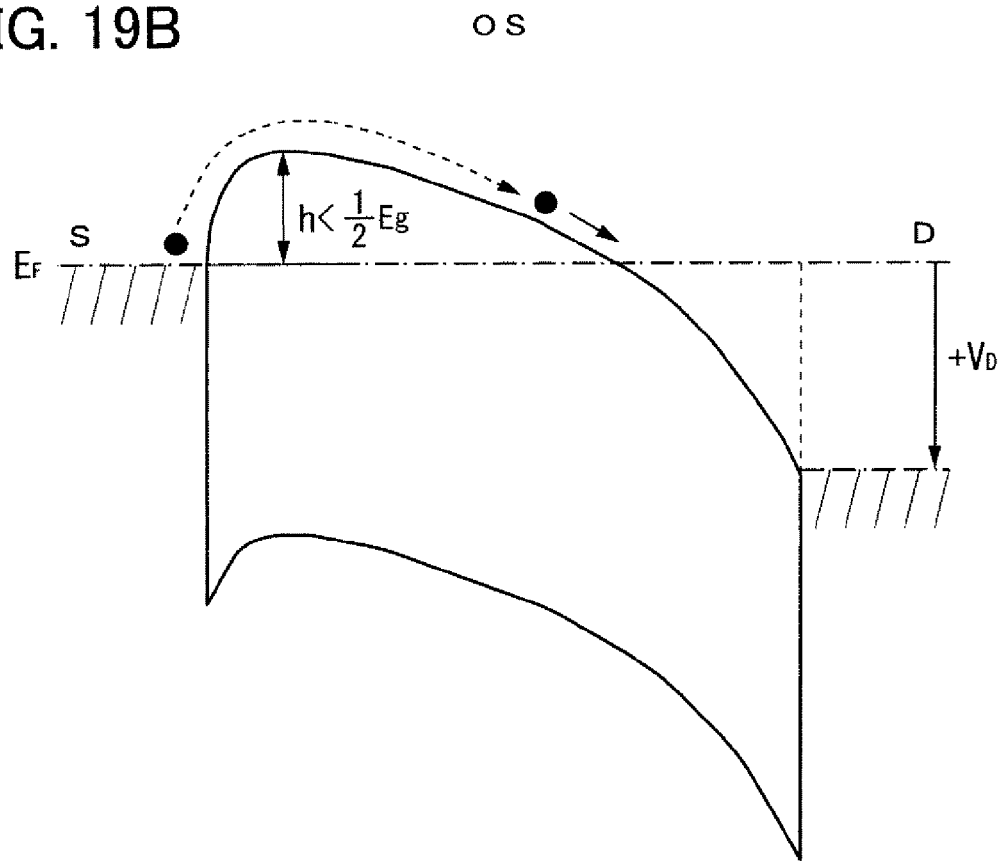
FIG. 19B is an energy band diagram at the time when a voltage is applied.

FIGS. 19A and 19B are energy band diagrams (schematic diagrams) of a cross section along A-A' in FIG. 18. FIG. 19A illustrates the case where the potential applied to the source is equal to the potential applied to the drain ($V_D=0$ V), and FIG. 19B illustrates the case where a positive potential with respect to the source is applied to the drain ($V_D>0$ V).

Figure 20A:
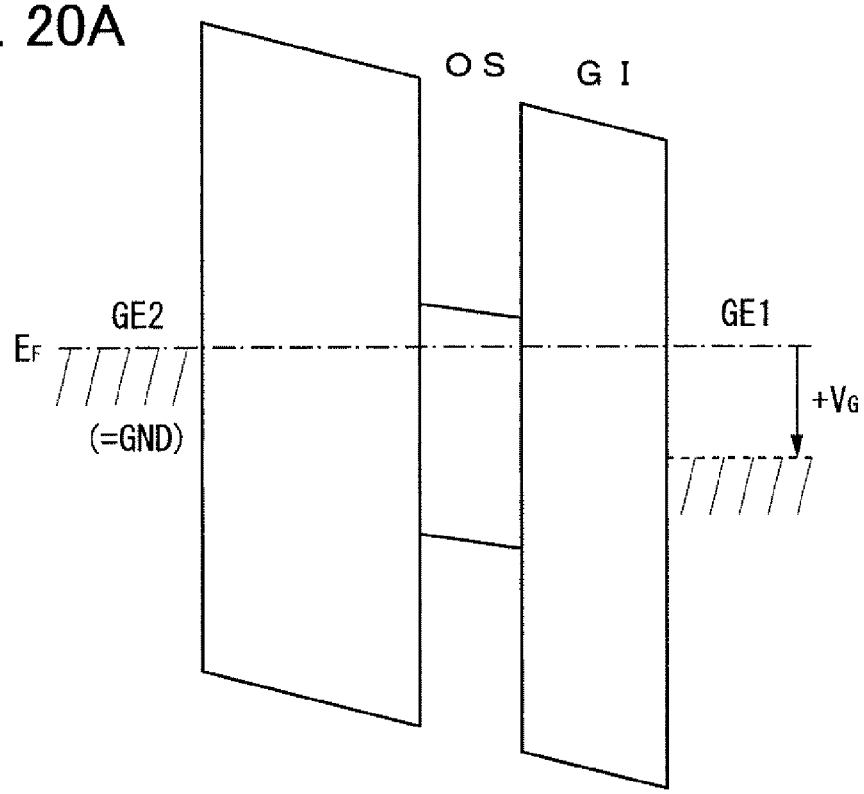
FIG. 20A is an energy band diagram illustrating a state in which positive potential ($+V_G$) is applied to a gate (G1)
Figure 20B:
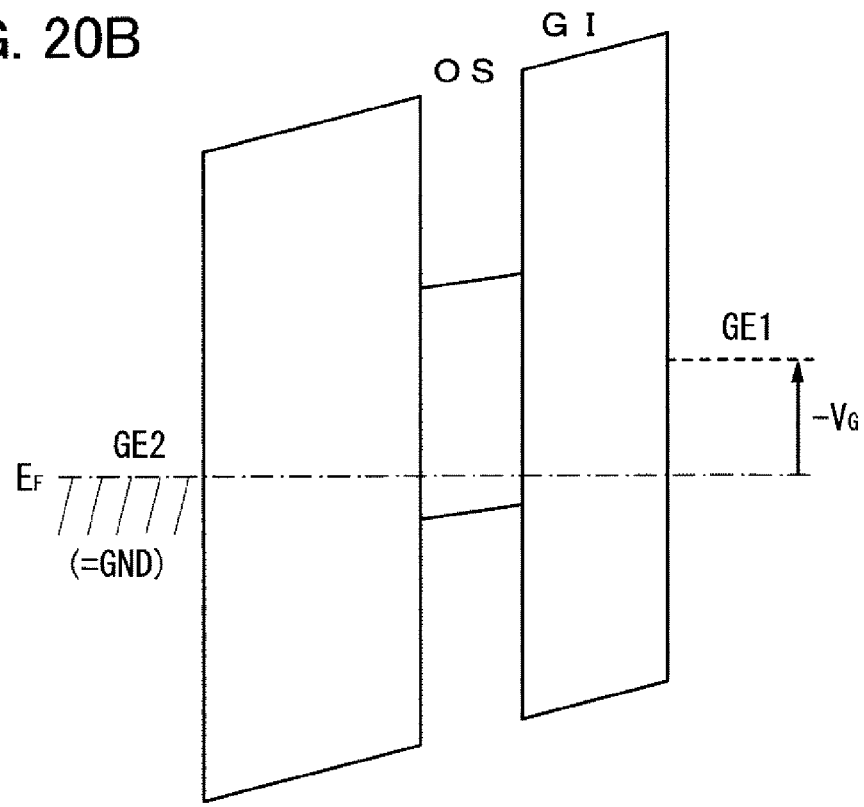
FIG. 20B is an energy band diagram illustrating a state in which negative potential ($-V_G$) is applied to a gate (G1).

FIGS. 20A and 20B are energy band diagrams (schematic diagrams) of a cross section along B-B' in FIG. 18. FIG. 20A illustrates an on state in which a positive potential ($+V_G$) is applied to a gate electrode (GE1) and carriers (electrons) flow between the source and the drain. FIG. 20B illustrates an off state in which a negative potential ($-V_G$) is applied to the gate (GE1) and minority carriers do not flow.

Figure 21:
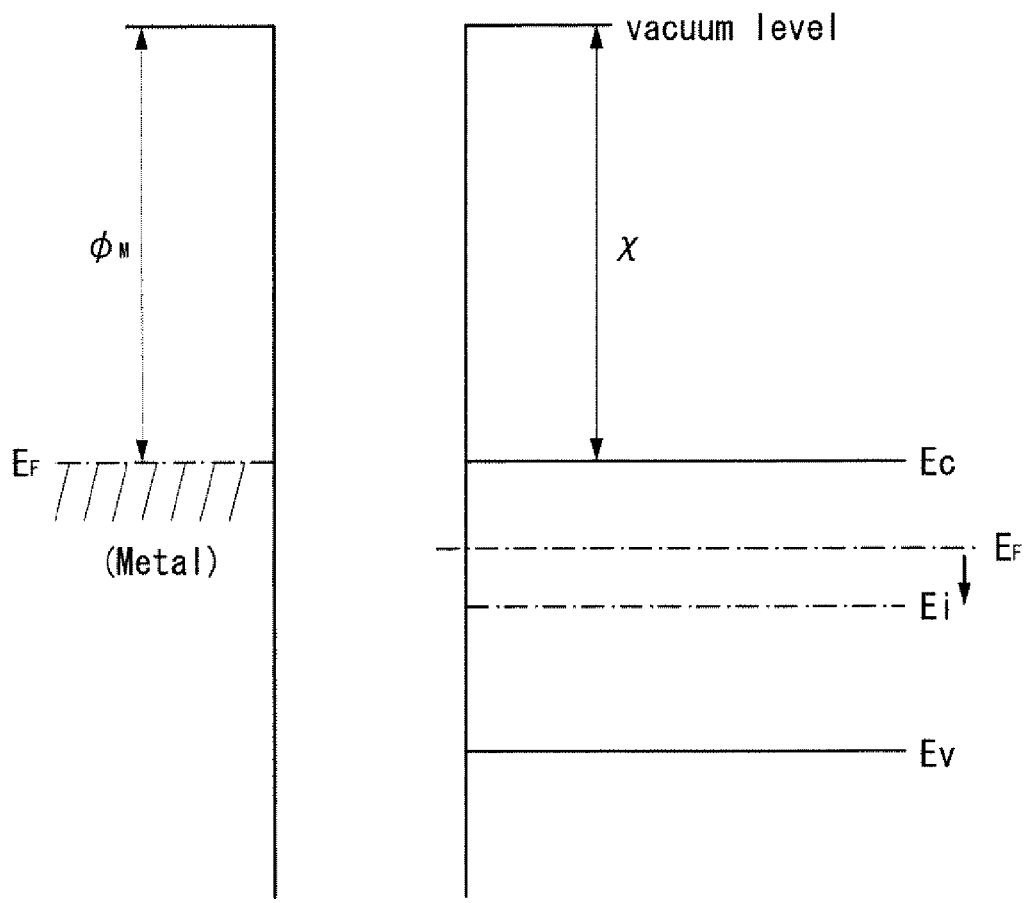
FIG. 21 is an energy band diagram illustrating relationships between a vacuum level and a work function of a metal ($\phi M$) and between the vacuum level and electron affinity ($\chi$) of an oxide semiconductor.

FIG. 21 illustrates the relationships between the vacuum level and the work function of a metal ($\phi M$) and between the vacuum level and the electron affinity ($\chi$) of an oxide semiconductor.

A conventional oxide semiconductor is typically an n-type semiconductor, and the Fermi level ($E_F$) is away from the intrinsic Fermi level (Ei) located in the middle of a band gap and is located closer to the conduction band. Note that since hydrogen can serve as a donor, hydrogen is known as a factor to make the oxide semiconductor layer n-type.

On the other hand, an oxide semiconductor according to the present invention is an intrinsic (i-type) or a substantially intrinsic oxide semiconductor which is obtained by removing hydrogen that is an n-type impurity from an oxide semiconductor and highly purifying the oxide semiconductor such that an impurity is prevented from being contained therein as much as possible. In other words, a feature is that a highly purified i-type (intrinsic) semiconductor or a semiconductor close thereto is obtained by removing an impurity such as hydrogen or water as much as possible. This enables the Fermi level ($E_F$) to be at the same level as the intrinsic Fermi level (Ei).

The electron affinity ($\chi$) of an oxide semiconductor is said to be 4.3 eV. The work function of titanium (Ti) included in the source electrode and the drain electrode is substantially equal to the electron affinity ($\chi$) of the oxide semiconductor. In that case, a Schottky barrier to electrons is not formed at an interface between the metal and the oxide semiconductor.

In other words, in the case where the work function of the metal ($\phi M$) and the electron affinity ($\chi$) of the oxide semiconductor are equal to each other and the metal and the oxide semiconductor are in contact with each other, an energy band diagram (a schematic diagram) as illustrated in FIG. 19A is obtained.

In FIG. 19B, a black circle (●) represents an electron, and when a positive potential is applied to the drain, the electron is injected into the oxide semiconductor layer over the barrier (h) and flows toward the drain. In that case, the height of the barrier (h) changes depends on the gate voltage and the drain voltage; in the case where a positive drain voltage is applied, the height of the barrier (h) is smaller than the height of the barrier in FIG. 19A where no voltage is applied, i.e., ½ of the band gap (Eg).

At this time, the electron injected into the oxide semiconductor layer flows through the oxide semiconductor layer as illustrated in FIG. 20A. In addition, in FIG. 20B, when a negative potential is applied to the gate electrode (GE1) the value of current is as close to zero as possible because holes that are minority carriers do not substantially exist.

For example, even a thin film transistor has a channel width W of $1\times10^4$ μm and a channel length of 3 μm, an off-state current is less than or equal to $10^{-13}$ A and a subthreshold swing (S value) is 0.1 V/dec. (the thickness of the gate insulating film: 100 nm).

In this manner, when the oxide semiconductor layer is highly purified so that impurities are contained as little as possible, the operation of the thin film transistor can be favorable.

Therefore, the above transistors 503 and 540 formed using the oxide semiconductor layer are thin film transistors having stable electric characteristics and high reliability.

As the oxide semiconductor layer included in each of the transistor 503 and the transistor 540, any of a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, or a two-component metal oxide such as an In—Zn—O film, a Sn—Zn—O film, an Al—Zn—O film, a Zn—Mg—O film, a Sn—Mg—O film, an In—Mg—O film, an In—O film, a Sn—O film, and a Zn—O film can be used. Further, $SiO_2$ may be contained in the above oxide semiconductor layer.

Note that as the oxide semiconductor layer, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor layer whose composition formula is represented by $InMO_3(ZnO)_m$ (m>0), which includes Ga as M, is referred to as the In—Ga—Zn—O oxide semiconductor described above, and a thin film of the In—Ga—Zn—O oxide semiconductor is also referred to as an In—Ga—Zn—O-based non-single-crystal film.

Here, a pin photodiode in which a semiconductor layer having p-type conductivity as the first semiconductor layer 506a, a high-resistance semiconductor layer (i-type semiconductor layer) as the second semiconductor layer 506b, and a semiconductor layer having n-type conductivity as the third semiconductor layer 506c are stacked is illustrated as an example.

The first semiconductor layer 506a is a p-type semiconductor layer and can be formed using an amorphous silicon film containing an impurity element imparting p-type conductivity. The first semiconductor layer 506a is formed with a plasma CVD method with the use of a semiconductor source gas containing an impurity element belonging to Group 13 (such as boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion injecting method. Heating or the like may be performed after introducing the impurity element with an ion injecting method or the like in order to diffuse the impurity element. In this case, as a method of forming the amorphous silicon film, an LPCVD method, a chemical vapor deposition method, a sputtering method, or the like may be used. The first semiconductor layer 506a is preferably formed to have a thickness of greater than or equal to 10 nm and less than or equal to 50 nm.

The second semiconductor layer 506b is an i-type semiconductor layer (intrinsic semiconductor layer) and is formed with an amorphous silicon film. As for formation of the second semiconductor layer 506b, an amorphous silicon film is formed with a plasma CVD method using a semiconductor material gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 506b may be alternatively formed with an LPCVD method, a chemical vapor deposition method, a sputtering method, or the like. The second semiconductor layer 506b is preferably formed to have a thickness of greater than or equal to 200 nm and less than or equal to 1000 nm.

The third semiconductor layer 506c is an n-type semiconductor layer and is formed with an amorphous silicon film containing an impurity element imparting n-type conductivity. The third semiconductor layer 506c is formed with a plasma CVD method using a semiconductor material gas containing an impurity element belonging to Group 15 (such as phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion injecting method. Heating or the like may be performed after the impurity element is introduced with an ion injecting method or the like in order to diffuse the impurity element. In this case, as a method of forming the amorphous silicon film, an LPCVD method, a chemical vapor deposition method, a sputtering method, or the like may be used. The third semiconductor layer 506c is preferably formed to have a thickness of greater than or equal to 20 nm and less than or equal to 200 nm.

The first semiconductor layer 506a, the second semiconductor layer 506b, and the third semiconductor layer 506c are not necessarily formed using an amorphous semiconductor, and they may be formed using a polycrystalline semiconductor or a microcrystalline semiconductor (a semi-amorphous semiconductor (SAS)).

The microcrystalline semiconductor belongs to a metastable state of an intermediate between amorphous and single crystalline when Gibbs free energy is considered. That is, the microcrystalline semiconductor film is a semiconductor having a third state which is thermodynamically stable and has a short range order and lattice distortion. Columnar-like or needle-like crystals grow in a normal direction with respect to a substrate surface. The Raman spectrum of microcrystalline which is a typical example of a microcrystalline semiconductor, is shifted to a small wavenumber region below 520 $cm^{-1}$ which represents single-crystalline silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 atomic % or more in order to terminate a dangling bond. Moreover, microcrystalline silicon may contain a rare gas element such as helium, argon, krypton, or neon to further promote lattice distortion, so that a microcrystalline semiconductor film with high thermodynamic stability can be obtained.

The microcrystalline semiconductor film can be formed with a high-frequency plasma CVD method with a frequency of several tens of MHz to several hundreds of MHz or with a microwave plasma CVD method with a frequency of greater than or equal to 1 GHz. Typically, the microcrystalline semiconductor film can be formed using a silicon hydride such as $SiH_4$, $Si_2H_6$, $SiH_2Cl_2$ or $SiHCl_3$, or a silicon halide such as $SiCl_4$ or $SiF_4$, which is diluted with hydrogen. With a dilution with one or a plural kinds of rare gas elements selected from helium, argon, krypton, or neon in addition to silicon hydride and hydrogen, the microcrystalline semiconductor film can be formed. In that case, the flow ratio of hydrogen to the silicon hydride is 5:1 to 200:1, preferably, 50:1 to 150:1, more preferably, 100:1. Further, a hydrocarbon gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here, an example where light received by the photodiode 502 from a surface of the substrate 501, over which a pin photodiode is formed, is converted into electric signals will be described. Further, light from the semiconductor layer having a conductivity type opposite to that of the semiconductor layer on the light-receiving plane is disturbance light; therefore, the electrode layer is preferably formed using a light-blocking conductive film. Note that a surface on the n-type semiconductor layer side can alternatively be used as the light-receiving plane.

The liquid crystal element 505 includes a pixel electrode 507, liquid crystal 508, a counter electrode 509, an alignment film 511, and an alignment film 512. The pixel electrode 507 is formed over the substrate 501, and the alignment film 511 is formed over the pixel electrode 507. The pixel electrode 507 is electrically connected to the transistor 503 through a conductive film 510. A substrate 513 (a counter substrate) is provided with the counter electrode 509, the alignment film 512 is formed on the counter electrode 509, and the liquid crystal 508 is interposed between the alignment film 511 and the alignment film 512. The transistor 503 corresponds to the transistor 201 in Embodiment 1.

A cell gap between the pixel electrode 507 and the counter electrode 509 can be controlled by using a spacer 516. In FIG. 6, the cell gap is controlled by using the columnar spacer 516 selectively formed by photolithography. Alternatively, the cell gap can be controlled by dispersing spherical spacers between the pixel electrode 507 and the counter electrode 509.

The liquid crystal 508 is surrounded by a sealing material between the substrate 501 and the substrate 513. The liquid crystal 508 may be injected with a dispenser method (droplet method) or a dipping method (pumping method).

For the pixel electrode 507, a light-transmitting conductive material such as indium tin oxide (ITO), indium tin oxide containing silicon oxide (ITSO), organic indium, organic tin, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used. A conductive composition containing a conductive macromolecule (also referred to as a conductive polymer) can be used to form the pixel electrode 507. As the conductive macromolecule, a so-called n-electron conjugated conductive polymer can be used. For example, polyaniline or a derivative thereof, polypyrrole or a derivative thereof, polythiophene or a derivative thereof, a copolymer of two or more kinds of them, and the like can be given.

Since the transparent liquid crystal element 505 is given as an example in this embodiment, the light-transmitting conductive material described above can be used also for the counter electrode 509 as in the case of the pixel electrode 507.

An alignment film 511 is provided between the pixel electrode 507 and the liquid crystal 508, and an alignment film 512 is provided between the counter electrode 509 and the liquid crystal 508. The alignment film 511 and the alignment film 512 can be formed using an organic resin such as a polyimide or poly(vinyl alcohol). Alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that by using an inorganic material such as silicon oxide, the alignment film 511 and the alignment film 512 each having an alignment property can be directly formed with an evaporation method without performing an alignment treatment.

Further, a color filter 514 through which light in a particular wavelength range can pass is formed over the substrate 513 so as to overlap with the liquid crystal element 505. The color filter 514 can be selectively formed by photolithography after application of an organic resin such as an acrylic-based resin in which colorant is dispersed on the substrate 513. Alternatively, the color filter 514 can be selectively formed by etching after application of a polyimide-based resin in which colorant is dispersed on the substrate 513. Alternatively, the color filter 514 can be selectively formed with a droplet discharge method such as an ink-jet method.

Furthermore, a shielding film 515 which can block light is formed over the substrate 513 so as to overlap with the photodiode 502. By providing the shielding film 515, light from a backlight that passes through the substrate 513 and enters the touch panel can be prevented from being directly delivered to the photodiode 502. Further, disclination due to disorder of alignment of the liquid crystal 508 among pixels can be prevented from being viewed. An organic resin containing black colorant such as carbon black or a low-valent titanium oxide can be used for the shielding film 515. Alternatively, a film formed using chromium can be used for the shielding film 515.

Furthermore, a polarizing plate 517 is provided on a surface which is the opposite side of a surface of the substrate 501 over which the pixel electrode 507 is fainted, and a polarizing plate 518 is provided on a surface which is the opposite side of a surface of the substrate 513 on which the counter electrode 509 is formed.

With the use of an insulating material, the oxide insulating layer 531, the protective insulating layer 532, the interlayer insulating layer 533, and the interlayer insulating layer 534 can be formed, depending on the material, with a method such as a sputtering method, an SOG method, spin coating, dip coating, spray coating, or a droplet discharge method (e.g., an ink-jet method, screen printing, offset printing, or the like), or a tool (equipment) such as a doctor knife, a roll coater, a curtain coater, or a knife coater.

As the oxide insulating layer 531, a single layer or a stacked layer of an oxide insulating layer such as a silicon oxide layer, a silicon oxynitride layer, an aluminum oxide layer, an aluminum oxynitride layer, or the like can be used.

As an inorganic insulating material of the protective insulating layer 532, a single layer or a stacked layer of a nitride insulating layer such as a silicon nitride layer, a silicon nitride oxide layer, an aluminum nitride layer, an aluminum nitride oxide layer, or the like can be used. High-density plasma CVD with the use of microwaves (2.45 GHz) is preferably employed because form nation of a dense and high-quality insulating layer having high withstand voltage is possible.

For reduction of the surface roughness, an insulating layer functioning as a planarization insulating film is preferably used as the interlayer insulating layers 533 and 534. The interlayer insulating layers 533 and 534 can be formed using an organic insulating material having heat resistance such as a polyimide, an acrylic resin, a benzocyclobutene-based resin, a polyamide, or an epoxy resin. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

The liquid crystal element may be a TN (twisted nematic) mode liquid crystal element, a VA (vertical alignment) mode liquid crystal element, an OCB (optically compensated birefringence) mode liquid crystal element, an IPS (in-plane switching) mode liquid crystal element, or the like. Alternatively, liquid crystal exhibiting a blue phase for which an alignment film is unnecessary may be used. The blue phase is one of liquid crystal phases and a phase which appears just before the transition from a cholesteric phase to an isotropic phase when the temperature of cholesteric liquid crystal is increased. A blue phase appears only within a narrow temperature range; therefore, the liquid crystal 508 is formed using a liquid crystal composition containing a chiral agent at 5 wt. % or more in order to expand the temperature range. The liquid crystal composition including liquid crystal exhibiting a blue phase and a chiral agent has a short response time of 1 millisecond or less and are optically isotropic; therefore, alignment treatment is unnecessary, and viewing angle dependence is small. In addition, since an alignment film does not need to be provided and rubbing treatment is unnecessary, electrostatic discharge damage caused by the rubbing treatment can be prevented and defects and damage of the touch panel can be reduced in the manufacturing process. Thus, productivity of the touch panel can be increased.

Note that although the liquid crystal element 505 in which the liquid crystal 508 is interposed between the pixel electrode 507 and the counter electrode 509 is described as an example in this embodiment, the touch panel according to an embodiment of the present invention is not limited to this structure. A liquid crystal element in which a pair of electrodes is formed on the substrate 501 side like an IPS mode liquid crystal element may also be employed.

Light from the backlight passes through the substrate 513 and the liquid crystal element 505 and is delivered to an object 521 on the substrate 501 side as shown by an arrow 520. Then, light reflected by the object 521 enters the photodiode 502 as shown by an arrow 522.

When ambient light is detected, the display device receives ambient light from the substrate (TFT substrate) 501 side. The ambient light is blocked by the object 521 and thus, light to be incident on the photodiode 502 is blocked. That is, the photodiode 502 is to detect a shadow of the object.

With the above structure, a display panel where data can be inputted by detection of motion of a contactless object can be provided.

In addition, the display device of this embodiment can also detect an object even when the object is close to the display panel. The distance can be set to three centimeters or shorter. The display device of this embodiment is more effective than a device provided with a CCD image sensor or the like.

Further, in the display device of this embodiment, a light receiving surface of the photosensor (the photodiode 502) and a display surface of the display panel (on the substrate 501 side) face in the same direction. Therefore, an image of the object can be shot in the display panel. The display device of this embodiment is more effective than a device provided with a CCD image sensor or the like.

This embodiment can be implemented in appropriate combination with any of the other embodiments and examples.
(Embodiment 4)

In this embodiment, another structure of a display panel according to an embodiment of the present invention will be described with reference to FIG. 7.

Figure 7:
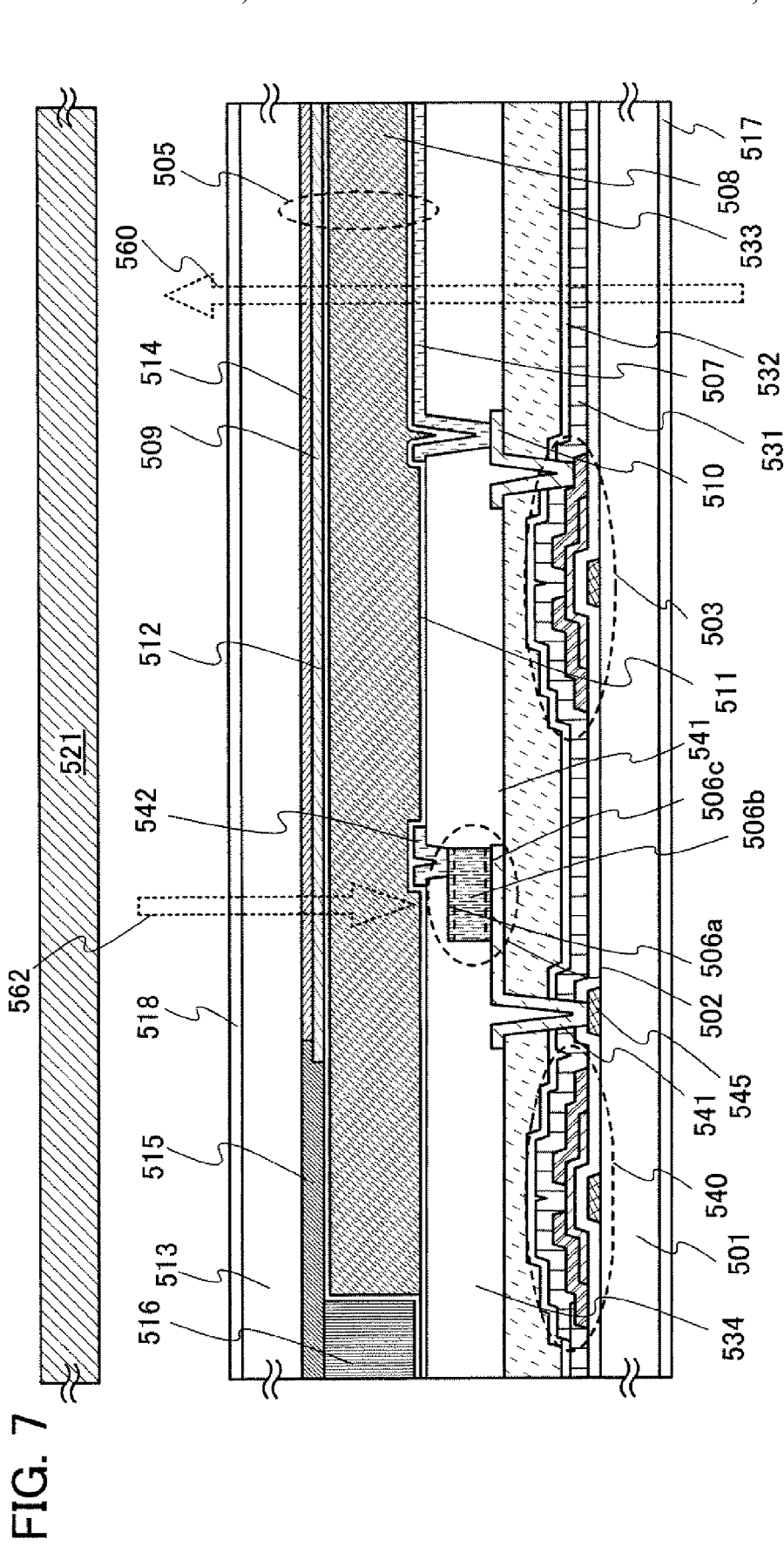
FIG. 7 is a cross-sectional view of a display panel.

FIG. 7 illustrates an example of a cross-sectional view of a display panel which is different from that in Embodiment 3. The display panel illustrated in FIG. 7 shows an example where electric signals are obtained by converting light which enters the photodiode 502 through the counter substrate 513 opposed to the substrate 501, over which a pin photodiode is formed, after being reflected on the object 521 to be detected.

Light from the backlight passes through the substrate 501 and the liquid crystal element 505 and is delivered to the object 521 on the substrate 513 side as shown by an arrow 560. Then, light reflected by the object 521 enters the photodiode 502 as shown by an arrow 562. Note that in this structure, the shielding film 515 is not provided in a region where the light shown by the arrow 562 passes therethrough. For example, an opening may be formed in the shielding film 515 above the photodiode 502 so that light reflected by the object 521 can enter the photodiode 502.

Since the field-effect mobility of holes generated by the photoelectric effect is lower than that of electrons, a pin photodiode has better characteristics when a surface on the p-type semiconductor layer side is used as a light-receiving plane. Here, light which the photodiode 502 receives through the counter substrate 513 is converted into electric signals. Further, light from the semiconductor layer having a conductivity type opposite to that of the semiconductor layer on the light-receiving plane is disturbance light; therefore, the electrode layer 541 is preferably formed using a light-blocking conductive film. Note that a surface on the n-type semiconductor layer side can alternatively be used as the light-receiving plane.

Therefore, in the photodiode 502 of this embodiment, the third semiconductor layer 506c having n-type conductivity, the second semiconductor layer 506b which is a high-resistance semiconductor layer (i-type semiconductor layer), a first semiconductor layer 506a having p-type conductivity, and an electrode layer 542 are stacked in that order over an electrode layer 541 connected to the gate electrode layer 545.

A shielding film may be provided below the photodiode 502. The shielding film can prevent the light, from the backlight, which passes through the substrate (TFT substrate) 501 and enters the display panel from reaching the photodiode 502 directly; thus, a display panel where a high resolution image can be shot can be provided. The shielding film can be formed using an organic resin containing a black pigment such as a carbon black or titanium lower oxide. Alternatively, a film of chromium can be used for the shielding film.

When infrared light is detected using the photodiode 502, the color filter 514 which transmits infrared light may be provided over the photodiode 502. In that case, the color filter preferably has a stack of color filters of different colors.

Moreover, when ambient light is detected, the display panel receives ambient light from the substrate (counter substrate) 513 side. The ambient light is blocked by the object 521 and thus, light to be incident on the photodiode 502 is blocked. That is, the photodiode 502 is to detect a shadow of the object.

The distance between the object and the display panel, and the directions of the light receiving surface of the photosensor and the display surface of the display panel are similar to those in Embodiment 3. The light receiving surface of the photosensor faces in the same direction as the display surface of the display panel (toward the counter substrate 513); thus, an image of the object can be shot in the display panel.

This embodiment can be implemented in appropriate combination with any of the other embodiments and examples.

(Embodiment 5)

In this embodiment, an example of a thin film transistor which can be applied to the display panel disclosed in this specification will be described. A thin film transistor 390 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4). The same portions as those in the above embodiments and portions having functions similar to those of the portions in the above embodiments and steps similar to those in the above embodiments may be handled as in the above embodiments, and repeated description is omitted. In addition, detailed description of the same portions is also omitted.

An embodiment of a manufacturing method of the thin film transistor of this embodiment is described with reference to FIGS. 12A to 12E.

FIGS. 12A to 12E illustrate an example of a cross-sectional structure of a thin film transistor. The thin film transistor 390 illustrated in FIGS. 12A to 12E is one of bottom gate thin film transistors and is also referred to as an inverted staggered thin film transistor.

Although description is given using a single-gate thin film transistor as the thin film transistor 390, a multi-gate thin film transistor including a plurality of channel formation regions may be formed as needed.

A process of manufacturing the thin film transistor 390 over a substrate 394 is described below with reference to FIGS. 12A to 12E.

First, after a conductive film is formed over the substrate 394 having an insulating surface, a gate electrode layer 391 is formed in a first photolithography process. The gate electrode layer preferably has a tapered shape because coverage with a gate insulating layer stacked thereover can be improved. Note that a resist mask may be formed by an ink-jet method. When the resist mask is formed by an ink-jet method, a photomask is not used; therefore, manufacturing costs can be reduced.

There is no particular limitation on a substrate that can be used as the substrate 394 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. By containing a larger amount of barium oxide (BaO) than boron oxide, a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 394. Alternatively, a crystallized glass substrate or the like may be used. Still alternatively, a plastic substrate or the like can be used as appropriate.

An insulating film serving as a base film may be provided between the substrate 394 and the gate electrode layer 391. The base film has a function of preventing diffusion of an impurity element from the substrate 394, and can be formed with a single-layer structure or a layered structure using any of a silicon nitride film, a silicon oxide film, a silicon nitride oxide film, and a silicon oxynitride film.

The gate electrode layer 391 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 391, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive film. A light-transmitting conductive oxide can be given as an example of the light-transmitting conductive oxide film.

Then, a gate insulating layer 397 is formed over the gate electrode layer 391.

The gate insulating layer 397 can be formed with a single-layer structure or a layered structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. In the case where a silicon oxide film is formed by a sputtering method, a silicon target or a quartz target is used as a target and oxygen or a mixed gas of oxygen and argon is used as a sputtering gas.

Here, an oxide semiconductor that becomes intrinsic or substantially intrinsic by removal of impurities (a highly purified oxide semiconductor) is quite susceptible to the interface level or the interface charge; therefore, the interface with the gate insulating layer is important. Thus, the gate insulating layer 397 that is to be in contact with a highly purified oxide semiconductor layer needs to have high quality.

For example, a high-density plasma CVD method using microwaves (2.45 GHz) is preferably adopted because the formed insulating layer can be dense and have high withstand voltage and high quality. When a highly purified oxide semiconductor and a high-quality gate insulating layer are in contact with each other, the number of the interface levels can be reduced and interface characteristics can be favorable.

It is needless to say that another film formation method such as a sputtering method or a plasma CVD method can be employed as long as a high-quality insulating layer can be formed as a gate insulating layer. Moreover, it is possible to use as the gate insulating layer an insulating layer whose quality and characteristics of an interface with an oxide semiconductor are improved with heat treatment performed after the formation of the insulating layer. In any case, an insulating layer that can reduce interface level density with an oxide semiconductor to form a favorable interface, as well as having favorable film quality as the gate insulating layer, is formed.

The gate insulating layer 397 may have a structure where a nitride insulating layer and an oxide insulating layer are stacked over the gate electrode layer 391. For example, a silicon nitride layer ($SiN_y$ (y>0)) with a thickness of 50 nm to 200 nm inclusive is formed by a sputtering method as a first gate insulating layer and a silicon oxide layer ($SiO_x$ (x>0)) with a thickness of 5 nm to 300 nm inclusive is stacked as a second gate insulating layer over the first gate insulating layer. The thickness of the gate insulating layer may be set as appropriate depending on characteristics needed for a thin film transistor and may be approximately 350 nm to 400 nm.

An oxide semiconductor layer 393 is formed over the gate insulating layer 397. Here, if an impurity is included in the oxide semiconductor layer 393, a bond between the impurity and a main component of the oxide semiconductor is cleaved by a stress such as high electric field or high temperature to result in a dangling bond, which causes a shift of the threshold voltage (Vth).

Therefore, the oxide semiconductor layer 393 and the gate insulating layer 397 which contacts with the oxide semiconductor layer 393 are formed so that impurities, particularly hydrogen and water, are not included therein as little as possible, which allows formation of the thin layer transistor 390 with stable characteristics.

In order that hydrogen, a hydroxyl group, and moisture might be contained in the gate insulating layer 397 and the oxide semiconductor layer 393 as little as possible, it is preferable that the substrate 394 over which the gate electrode layer 391 is formed or the substrate 394 over which layers up to the gate insulating layer 397 are formed be preheated in a preheating chamber of a sputtering apparatus and the like as pretreatment for film formation so that impurities such as hydrogen and moisture adsorbed to the substrate 394 is eliminated. The temperature for the preheating is 100° C. to 400° C. inclusive, preferably 150° C. to 300° C. inclusive. Note that a cryopump is preferable as an evacuation unit provided in the preheating chamber. Note that this preheating treatment may be omitted. Further, this preheating may be similarly performed on the substrate 394 over which layers up to a source electrode layer 395a and a drain electrode layer 395b have been formed, before formation of an oxide insulating layer 396.

Figure 12A:
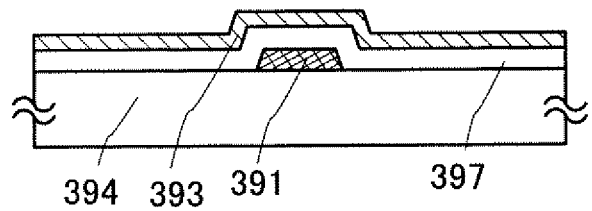
FIGS. 12A to 12E illustrate a thin film transistor and a method for manufacturing the thin film transistor.

Then, the oxide semiconductor layer 393 is formed to a thickness of 2 nm to 200 nm inclusive over the gate insulating layer 397 (see FIG. 12A).

Note that before the oxide semiconductor layer 393 is formed by a sputtering method, dust attached to a surface of the gate insulating layer 397 is preferably removed with reverse sputtering in which an argon gas is introduced and plasma is generated. The reverse sputtering refers to a method in which an RF power source is used for application of a voltage to the substrate side in an argon atmosphere so that plasma is generated in the vicinity of the substrate to modify a surface of the substrate. Note that instead of an argon atmosphere, a nitrogen atmosphere, a helium atmosphere, an oxygen atmosphere, or the like may be used.

The oxide semiconductor layer 393 is formed by a sputtering method. The oxide semiconductor layer 393 is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. The oxide semiconductor layer 393 can be formed by a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation. In this embodiment, the oxide semiconductor layer 393 is formed by a sputtering method with the use of an In—Ga—Zn—O-based oxide semiconductor target.

As a target for forming the oxide semiconductor layer 393 by a sputtering method, a metal oxide target containing zinc oxide as its main component can be used. As another example of a metal oxide target, an oxide semiconductor target containing In, Ga, and Zn (in a composition ratio, $In_2O_3:Ga_2O_3:ZnO=1:1:1$ [molar ratio]) can be used. Alternatively, an oxide semiconductor target containing In, Ga, and Zn (the composition ratio of $In_2O_3:Ga_2O_3:ZnO=1:1:2$ or 1:1:4 [molar ratio]) may be used. The filling rate of an oxide semiconductor target is 90% to 100% inclusive, preferably 95% to 99.9% inclusive. A dense oxide semiconductor layer is formed using an oxide semiconductor target with a high filling rate.

The substrate is held in a treatment chamber kept under reduced pressure, and the substrate is heated to a temperature of lower than 400° C. Then, a sputtering gas from which hydrogen and moisture are removed is introduced into the treatment chamber from which moisture is being removed, and the oxide semiconductor layer 393 is formed over the substrate 394 with the use of a metal oxide as a target. To remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor layer formed in the deposition chamber can be reduced. By performing deposition by sputtering while removing moisture in the treatment chamber with the use of a cryopump, a substrate temperature in the formation of the oxide semiconductor layer 393 can be higher than or equal to room temperature and lower than 400° C.

An example of the deposition conditions are as follows: the distance between the substrate and the target is 100 mm, the pressure is 0.6 Pa, the DC power is 0.5 kW, and the atmosphere is an oxygen atmosphere (the flow rate of oxygen is 100%). It is preferable that a pulsed DC power source be used because dust can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

There is also a multi-source sputtering apparatus in which a plurality of targets of different materials can be set. With the multi-source sputtering apparatus, films of different materials can be formed to be stacked in the same chamber, or plural kinds of materials can be discharged for film formation at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Figure 12B:
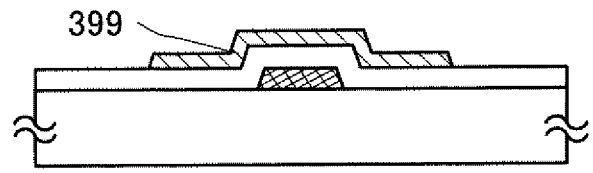
Figure 12C:
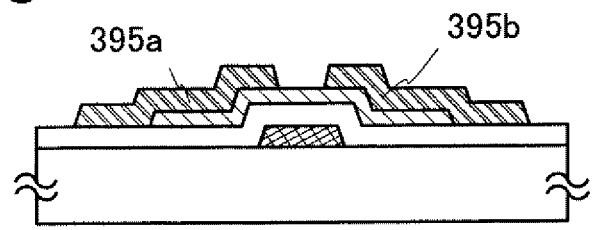

Then, in a second photolithography process, the oxide semiconductor layer is processed into an island-shaped oxide semiconductor layer 399 (see FIG. 12B). A resist mask for forming the island-shaped oxide semiconductor layer 399 may be formed by an ink-jet method. When the resist mask is formed by an ink-jet method, a photomask is not used; therefore, manufacturing costs can be reduced.

In forming the oxide semiconductor layer 399, a contact hole can be formed in the gate insulating layer 397.

Note that the etching of the oxide semiconductor layer 393 may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on the substrate side, the temperature of the electrode on the substrate side, or the like) are adjusted as appropriate.

As an etchant used for wet etching, a mixed solution of phosphoric acid, acetic acid, and nitric acid, an ammonia hydrogen peroxide mixture (hydrogen peroxide (31 wt % in water): ammonia water of 28 wt %: water=5; 2:2), or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the oxide semiconductor film can be etched to have a desired shape.

Note that it is preferable to perform reverse sputtering before formation of a conductive film in the following step so that a resist residue and the like attached to surfaces of the oxide semiconductor layer 399 and the gate insulating layer 397 can be removed.

Next, a conductive film is formed over the gate insulating layer 397 and the oxide semiconductor layer 399. The conductive film may be formed by a sputtering method or a vacuum evaporation method. As the material of the conductive film to be the source and drain electrode layers (including a wiring formed in the same layer as the source and drain electrode layers), there are an element selected from Al, Cr, Cu, Ta, Ti, Mo, or W; an alloy including any of the above elements; an alloy containing a combination of any of these elements; and the like. Alternatively, a structure may be employed in which a high-melting-point metal layer of Cr, Ta, Ti, Mo. W, or the like is stacked over one of or both metal layers of Al, Cu, and the like. Still alternatively, when an Al material to which an element preventing generation of hillocks and whiskers in an Al film, such as Si, Ti, Ta, W, Mo, Cr, Nd, Sc, or Y, is added is used, heat resistance can be increased.

The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given.

Alternatively, the conductive film to be the source and drain electrode layers (including a wiring formed in the same layer as the source and drain electrode layers) may be formed using a conductive metal oxide. As the conductive metal oxide, indium oxide ($In_2O_3$), tin oxide ($SnO_2$), zinc oxide (ZnO), a mixed oxide of indium oxide and tin oxide ($In_2O_3$—$SnO_2$, abbreviated to ITO), a mixed oxide of indium oxide and zinc oxide ($In_2O_3$—ZnO), or any of the metal oxides containing silicon or silicon oxide can be used.

A third photolithography process is performed. A resist mask is formed over the conductive film and selective etching is performed, so that the source electrode layer 395*a* and the drain electrode layer 395*b* are formed. Then, the resist mask is removed (see FIG. 12C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer 395*a* and a bottom portion of the drain electrode layer 395*b* which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased. Further, since an off current is significantly small in the thin film transistors of the present embodiment, low power consumption can be achieved.

Note that materials and etching conditions are adjusted as appropriate so that the oxide semiconductor layer 399 is not completely removed when the conductive film is etched.

In this embodiment, a Ti film is used as the conductive film, an In—Ga—Zn—O-based oxide semiconductor is used as the oxide semiconductor layer 399, and an ammonia hydrogen peroxide mixture (hydrogen peroxide (31 wt % in water): ammonia water of 28 wt %: water=5:2:2) is used as an etchant.

Note that in the third photolithography process, part of the oxide semiconductor layer 399 may be etched, whereby an oxide semiconductor layer having a groove (a depressed portion) may be formed. The resist mask used for forming the source electrode layer 395*a* and the drain electrode layer 395*b* may be formed by an ink-jet method. When the resist mask is formed by an ink-jet method, a photomask is not used; therefore, manufacturing costs can be reduced.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a multi-tone mask. Accordingly, the number of light-exposure masks can be reduced and the number of corresponding photolithography steps can be also reduced, whereby simplification of a process can be realized.

With plasma treatment with a gas such as $N_2O$, $N_2$, or Ar, water adsorbed to a surface of an exposed portion of the oxide semiconductor layer may be removed. Alternatively, plasma treatment may be performed using a mixed gas of oxygen and argon.

Figure 12D:
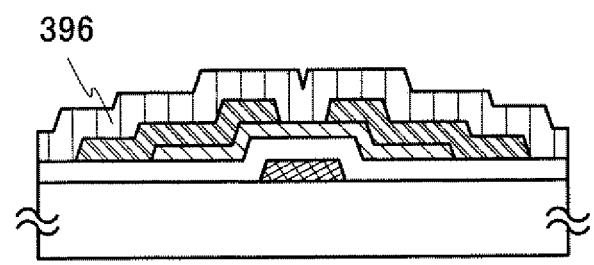

In the case of performing the plasma treatment, the oxide insulating layer 396 is sequentially formed without exposing the substrate 394 to the air (see FIG. 12D). Note that the oxide insulating layer 396 is in contact with part of the oxide semiconductor layer 399 and serves as a protective insulating film. In this embodiment, the oxide insulating layer 396 is formed in contact with the oxide semiconductor layer 399 in a region where the oxide semiconductor layer 399 does not overlap with the source electrode layer 395*a* and the drain electrode layer 395*b*.

In this embodiment, a silicon oxide layer having a defect is formed as the oxide insulating layer 396 with the use of a silicon target at a room temperature or a temperature lower than 100° C. under a sputtering gas atmosphere from which hydrogen and moisture are removed and which contains high-purity oxygen.

For example, a silicon oxide film is formed by a pulsed DC sputtering method in which the purity of a sputtering gas is 6N, a boron-doped silicon target (the resistivity is 0.01 Ω·cm) is used, the distance between the substrate and the target (T-S distance) is 89 mm, the pressure is 0.4 Pa, the DC power is 6 kW, and the atmosphere is an oxygen atmosphere (the oxygen flow rate is 100%). The thickness of the silicon oxide film is 300 nm. Note that instead of a silicon target, quartz (preferably, synthetic quartz) can be used as a target used when the silicon oxide film is formed. As a sputtering gas, oxygen or a mixed gas of oxygen and argon is used.

In that case, the oxide insulating layer 396 is preferably formed after removing moisture in the treatment chamber. This is for preventing hydrogen, a hydroxyl group, and moisture from being contained in the oxide semiconductor layer 399 and the oxide insulating layer 396.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 396 formed in the deposition chamber can be reduced.

Note that as the oxide insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the oxide insulating layer 396 and the oxide semiconductor layer 399 are in contact with each other. Since the oxide insulating layer 396 in this embodiment has many defects, with this heat treatment, an impurity such as hydrogen, moisture, a hydroxyl group, or a hydride contained in the oxide semiconductor layer 399 can be diffused to the oxide insulating layer 396 so that the impurity in the oxide semiconductor layer 399 can be further reduced.

Figure 12E:
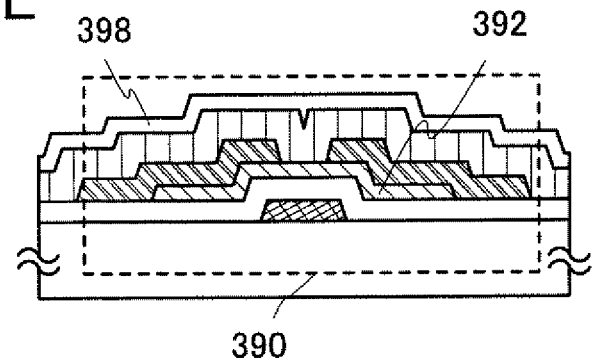

Through the above steps, the thin film transistor 390 including the oxide semiconductor layer 392 in which the concentration of hydrogen, moisture, a hydroxyl group, or a hydride is reduced can be formed (see FIG. 12E).

Moisture in a reaction atmosphere is removed as described above in forming the oxide semiconductor layer, whereby the concentration of hydrogen and hydride in the oxide semiconductor layer can be reduced. Accordingly, the oxide semiconductor layer can be stable.

A protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, an aluminum nitride oxide film, or the like is used.

The substrate 394 over which layers up to the oxide insulating layer 396 have been formed is heated to a temperature of 100° C. to 400° C., a sputtering gas from which hydrogen and moisture are removed and which contains high-purity nitrogen is introduced, and a silicon target is used, whereby a silicon nitride film is formed as the protective insulating layer 398. In this case, the protective insulating layer 398 is preferably formed after removing moisture in a treatment chamber, similarly to the oxide insulating layer 396.

In the case where the protective insulating layer 398 is formed, the substrate 394 is heated to 100° C. to 400° C. in forming the protective insulating layer 398, whereby hydrogen or water contained in the oxide semiconductor layer 392 can be diffused to the oxide insulating layer 396. In that case, heat treatment is not necessarily performed after formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed with the use of a common silicon target in the same treatment chamber. After a sputtering gas containing oxygen is introduced first, a silicon oxide layer is formed using a silicon target provided in the treatment chamber, and then, the sputtering gas is switched to nitrogen and the same silicon target is used to form a silicon nitride layer. Since the silicon oxide layer and the silicon nitride layer can be formed successively without exposing the oxide insulating layer 396 to the air, impurities such as hydrogen and moisture can be prevented from adsorbing onto a surface of the oxide insulating layer 396. After the protective insulating layer 398 is formed, heat treatment (at a temperature of 100° C. to 400° C.) for diffusing hydrogen or moisture contained in the oxide semiconductor layer to the oxide insulating layer may be performed.

After the protective insulating layer is formed, heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. Under a reduced pressure, the heating time can be shortened. With this heat treatment, reliability of a display panel can be further improved.

As mentioned above, moisture in a reaction atmosphere is removed in forming the oxide semiconductor layer to be a channel formation region over the gate insulating layer, whereby the concentration of hydrogen and hydride in the oxide semiconductor layer can be reduced.

The above steps can be used for manufacture of backplanes (substrates over which thin film transistors are formed) of liquid crystal display panels, electroluminescent display panels, display devices using electronic ink, or the like. Since the above steps can be performed at a temperature of 400° C. or lower, they can also be applied to manufacturing steps where a glass substrate with a thickness of 1 mm or smaller and a side of longer than 1 m is used. In addition, all of the above steps can be performed at a treatment temperature of 400° C. or lower; therefore, display panels can be manufactured without consuming much energy.

This embodiment can be implemented in appropriate combination with any of the other embodiments and examples.

Thus, with a thin film transistor including an oxide semiconductor layer, a large touch panel having stable electric characteristics and high reliability can be provided.

(Embodiment 6)

In this embodiment, another example of a thin film transistor which can be applied to the display panel disclosed in this specification will be described. A thin film transistor 310 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4). The same portions as those in the above embodiments and portions having functions similar to those of the portions in the above embodiments and steps similar to those in the above embodiments may be handled as in the above embodiments, and repeated description is omitted. In addition, detailed description of the same portions is also omitted.

An embodiment of a thin film transistor and a manufacturing method of the thin film transistor of this embodiment is described with reference to FIGS. 13A to 13E.

FIGS. 13A to 13E illustrate an example of a cross-sectional structure of a thin film transistor. The thin film transistor 310 illustrated in FIGS. 13A to 13E is one of bottom gate thin film transistors and is also referred to as an inverted staggered thin film transistor.

Although description is given using a single-gate thin film transistor as the thin film transistor 310, a multi-gate thin film transistor including a plurality of channel formation regions may be formed as needed.

A process of manufacturing the thin film transistor 310 over a substrate 305 is described below with reference to FIGS. 13A to 13E.

First, after a conductive film is formed over the substrate 305 having an insulating surface, a gate electrode layer 311 is formed in a first photolithography process. Note that a resist mask may be formed by an ink-jet method. When the resist mask is formed by an ink-jet method, a photomask is not used; therefore, manufacturing costs can be reduced.

There is no particular limitation on a substrate that can be used as the substrate 305 having an insulating surface as long as it has at least heat resistance enough to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. By containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 305. Alternatively, a crystallized glass substrate or the like may be used.

An insulating film serving as a base film may be provided between the substrate 305 and, the gate electrode layer 311. The base film has a function of preventing diffusion of an impurity element from the substrate 305, and can be formed with a single-layer structure or a layered structure using any of a silicon nitride film, a silicon oxide film, a silicon nitride oxide film, and a silicon oxynitride film.

The gate electrode layer 311 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 311, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable.

Then, the gate insulating layer 307 is formed over the gate electrode layer 311.

The gate insulating layer 307 can be formed with a single-layer structure or a layered structure using any of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed by a plasma CVD method with $SiH_4$, oxygen, and nitrogen for a deposition gas. The thickness of the gate insulating layer 307 is 100 nm to 500 nm inclusive, and in the case where the gate insulating layer 307 has a layered structure, a second gate insulating layer with a thickness of 5 nm to 300 nm inclusive is stacked over a first gate insulating layer with a thickness of 50 nm to 200 nm inclusive, for example.

In this embodiment, a silicon oxynitride layer having a thickness of 100 nm is formed as the gate insulating layer 307 by a plasma CVD method.

Then, an oxide semiconductor layer 330 is formed to a thickness of 2 nm to 200 nm inclusive over the gate insulating layer 307.

Note that before the oxide semiconductor layer 330 is formed by a sputtering method, dust attached to a surface of the gate insulating layer 307 is preferably removed with reverse sputtering in which an argon gas is introduced and plasma is generated. Note that instead of an argon atmosphere, a nitrogen atmosphere, a helium atmosphere, an oxygen atmosphere, or the like may be used.

Figure 13A:
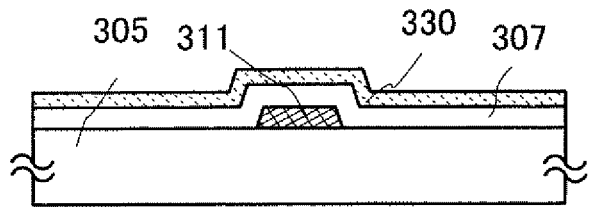
FIGS. 13A to 13E illustrate a thin film transistor and a method for manufacturing the thin film transistor.
Figure 13B:
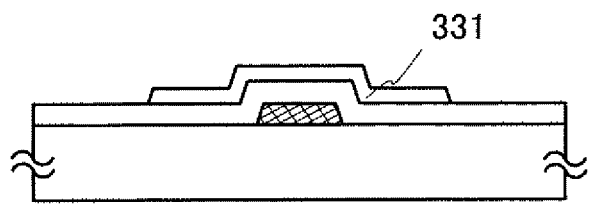
Figure 13C:
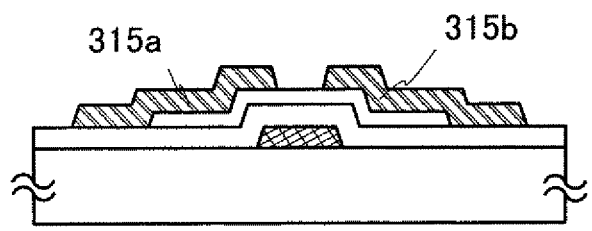
Figure 13D:
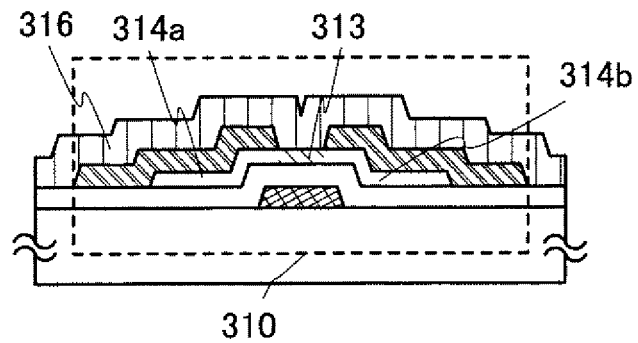
Figure 13E:
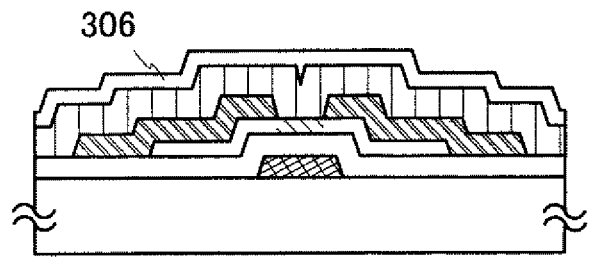
Figure 14A:
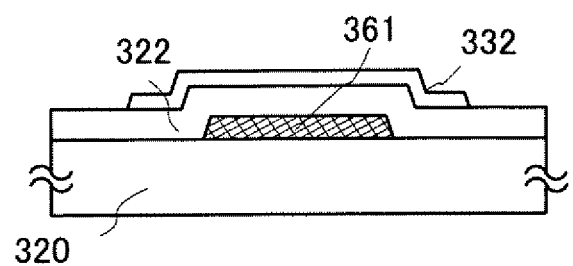
FIGS. 14A to 14D illustrate a thin film transistor and a method for manufacturing the thin film transistor.
Figure 14B:
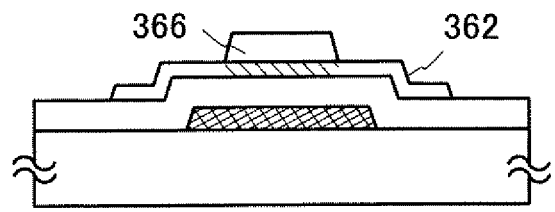
Figure 14C:
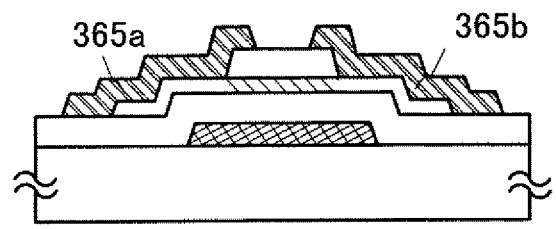
Figure 14D:
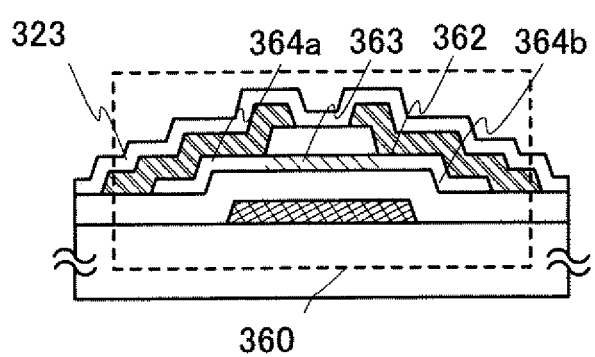

The oxide semiconductor layer 330 is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. The oxide semiconductor layer 330 can be formed by a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation. In this embodiment, the oxide semiconductor layer 330 is formed by a sputtering method with the use of an In—Ga—Zn—O-based metal oxide target. FIG. 13A corresponds to a cross-sectional view at this stage.

As a target for forming the oxide semiconductor layer 330 by a sputtering method, a metal oxide target containing zinc oxide as its main component can be used. As another example of a metal oxide target, an oxide semiconductor target containing In, Ga, and Zn (in a composition ratio, $In_2O_3$:$Ga_2O_3$:ZnO=1:1:1 [molar ratio]) can be used. Alternatively, an oxide semiconductor target containing In, Ga, and Zn (the composition ratio of $In_2O_3$:$Ga_2O_3$:ZnO=1:1:2 or 1:1:4 [molar ratio]) may be used. The filling rate of an oxide semiconductor target is 90% to 100% inclusive, preferably 95% to 99.9%. A dense oxide semiconductor layer is formed using an oxide semiconductor target with a high filling rate.

It is preferable to use a high-purity gas from which an impurity such as hydrogen, water, a substance having a hydroxyl group, or a hydride is removed to a concentration of several ppm or several ppb, as a sputtering gas when the oxide semiconductor layer 330 is formed.

The substrate is held in a treatment chamber kept under reduced pressure, and the substrate temperature is set to 100° C. to 600° C., preferably 200° C. to 400° C. Film formation is performed while the substrate is heated, whereby the concentration of an impurity contained in the oxide semiconductor layer formed can be reduced. Further, damages due to sputtering can be reduced. Then, a sputtering gas from which hydrogen and moisture are removed is introduced into the treatment chamber from which moisture is being removed, and the oxide semiconductor layer 330 is formed over the substrate 305 with the use of a metal oxide as a target. To remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor layer formed in the deposition chamber can be reduced.

An example of the deposition conditions are as follows: the distance between the substrate and the target is 100 mm, the pressure is 0.6 Pa, the DC power is 0.5 kW, and the atmosphere is an oxygen atmosphere (the flow rate of oxygen is 100%). It is preferable that a pulsed DC power source be used because dust can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

Then, in a second photolithography process, the oxide semiconductor layer 330 is processed into an island-shaped oxide semiconductor layer. A resist mask for forming the island-shaped oxide semiconductor layer may be formed by an ink-jet method. When the resist mask is formed by an ink-jet method, a photomask is not used; therefore, manufacturing costs can be reduced.

Next, the oxide semiconductor layer is subjected to first heat treatment. With the first heat treatment, dehydration or dehydrogenation of the oxide semiconductor layer can be conducted. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, and heat treatment is performed on the oxide semiconductor layer in a nitrogen atmosphere at 450° C. for one hour; thus, an oxide semiconductor layer 331 is obtained (see FIG. 13B).

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed in heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower).

Alternatively, the first heat treatment of the oxide semiconductor layer may be performed on the oxide semiconductor layer 330 which has not yet been processed into the island-shaped oxide semiconductor layer. In that case, after the first heat treatment, the substrate is taken out of the heating apparatus and a photolithography process is performed.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a protective insulating film is formed over the source electrode layer and the drain electrode layer.

In the case of forming a contact hole in the gate insulating layer 307, the step may be performed either before or after dehydration or dehydrogenation of the oxide semiconductor layer 330.

Note that the etching of the oxide semiconductor layer is not limited to wet etching and may be dry etching.

The etching conditions (such as an etchant, etching time, and temperature) are appropriately adjusted depending on the material so that the oxide semiconductor film can be etched to have a desired shape.

Next, a conductive film to be the source and drain electrode layers (including a wiring formed in the same layer as the source and drain electrode layers) is formed over the gate insulating layer 307 and the oxide semiconductor layer 331. The conductive film may be formed by a sputtering method or a vacuum evaporation method. As the material of the conductive film to be the source and drain electrode layers (including the wiring formed in the same layer as the source and drain electrode layers), there are an element selected from Al, Cr, Cu, Ta, Ti, Mo, or W; an alloy including any of the above elements; an alloy containing a combination of any of these elements; and the like. Alternatively, a structure may be employed in which a high-melting-point metal layer of Cr, Ta, Ti, Mo, W, or the like is stacked over one of or both metal layers of Al, Cu, and the like. Still alternatively, when an Al material to which an element preventing generation of hillocks and whiskers in an Al film, such as Si, Ti, Ta, W, Mo, Cr, Nd, Sc, or Y, is added is used, heat resistance can be increased.

The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given.

Alternatively, the conductive film to be the source and drain electrode layers (including a wiring formed in the same layer as the source and drain electrode layers) may be formed using a conductive metal oxide. As the conductive metal oxide, indium oxide ($In_2O_3$), tin oxide ($SnO_2$), zinc oxide (ZnO), a mixed oxide of indium oxide and tin oxide ($In_2O_3$—$SnO_2$, abbreviated to ITO), a mixed oxide of indium oxide and zinc oxide ($In_2O_3$—ZnO), or any of the metal oxides containing silicon or silicon oxide can be used.

If heat treatment is performed after formation of the conductive film, it is preferable that the conductive film have heat resistance enough to withstand the heat treatment.

A third photolithography process is performed. A resist mask is formed over the conductive film and selective etching is performed, so that a source electrode layer 315a and a drain electrode layer 315b are formed. Then, the resist mask is removed (see FIG. 13C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer 315a and a bottom portion of the drain electrode layer 315b which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased. Further, an off current is significantly small in the thin film transistors of the present embodiment, so that low power consumption can be achieved.

Note that materials and etching conditions are adjusted as appropriate so that the oxide semiconductor layer 331 is not completely removed when the conductive film is etched.

In this embodiment, a Ti film is used as the conductive film, an In—Ga—Zn—O-based oxide semiconductor is used as the oxide semiconductor layer 331, and an ammonia hydrogen peroxide mixture (hydrogen peroxide (31 wt % in water): ammonia water of 28 wt %: water=5:2:2) is used as an etchant.

Note that in the third photolithography process, part of the oxide semiconductor layer 331 may be etched, whereby an oxide semiconductor layer having a groove (a depressed portion) may be formed. The resist mask used for forming the source electrode layer 315a and the drain electrode layer 315b may be formed by an ink-jet method. When the resist mask is formed by an ink-jet method, a photomask is not used; therefore, manufacturing costs can be reduced.

Further, an oxide conductive layer may be formed between the oxide semiconductor layer 331 and the source and drain electrode layers 315a and 315b. The oxide conductive layer and the metal layer for forming the source and drain electrode layers can be formed successively. The oxide conductive layer can function as a source region and a drain region.

When the oxide conductive layer is provided as the source region and the drain region between the oxide semiconductor layer 331 and the source and drain electrode layers 315a and 315b, the source region and the drain region can have lower resistance and the transistor can operate at high speed.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a multi-tone mask. Accordingly, the number of light-exposure masks can be reduced and the number of corresponding photolithography steps can be also reduced, whereby simplification of a process can be realized.

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

After the plasma treatment is performed, an oxide insulating layer 316 which serves as a protective insulating film and is in contact with part of the oxide semiconductor layer is formed without exposure of the oxide semiconductor layer to the air.

The oxide insulating layer 316 can be formed to a thickness of longer than or equal to 1 nm by a sputtering method or the like as appropriate, which inhibits an impurity such as water or hydrogen from entering the oxide insulating layer 316. If hydrogen is contained in the oxide insulating layer 316, entry of the hydrogen to the oxide semiconductor layer or abstract of oxygen in the oxide semiconductor layer by the hydrogen might be caused, whereby a backchannel of the oxide semiconductor layer might decrease in resistance (to be n-type) and thus a parasitic channel might be formed. Therefore, it is important that a formation method in which hydrogen is not used is employed so that the oxide insulating layer 316 is formed containing as little hydrogen as possible.

The oxide insulating layer 316 which is formed in contact with the oxide semiconductor layer is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film. In this embodiment, a silicon oxide film is formed to a thickness of 200 nm as the oxide insulating layer 316 by a sputtering method. The substrate temperature in film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or an atmosphere containing a rare gas (typically, argon) and oxygen. Further, a silicon oxide target or a silicon target can be used as a target. For example, the silicon oxide film can be formed using a silicon target by a sputtering method in an atmosphere containing oxygen and nitrogen.

In that case, the oxide insulating layer 316 is preferably formed removing moisture in the treatment chamber. This is for preventing hydrogen, a hydroxyl group, and moisture from being contained in the oxide semiconductor layer 331 and the oxide insulating layer 316.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 316 formed in the deposition chamber can be reduced.

It is preferable to use a high-purity gas from which an impurity such as hydrogen, water, a hydroxyl group, or a hydride is removed to a concentration of several ppm or several ppb, as a sputtering gas when the oxide insulating layer 316 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. In the second heat treatment, the oxide semiconductor layer is heated while part of the oxide semiconductor layer (a channel formation region) is in contact with the oxide insulating layer 316.

Through the above steps, the initially formed oxide semiconductor layer is decreased in resistance by the first heat treatment for dehydration or dehydrogenation, and then part of the oxide semiconductor layer which is in contact with the oxide insulating layer 316 is selectively changed to be in an oxygen excess state by the second heat treatment. As a result, the channel formation region 313 which overlaps with the gate electrode layer 311 becomes intrinsic, and a high-resistance source region 314a and a high-resistance drain region 314b which overlap with the source electrode layer 315a and the drain electrode layer 315b, respectively, are formed in a self-aligned manner. Thus, the thin film transistor 310 is formed (see FIG. 13D).

When a silicon oxide layer having many defects is used as the oxide insulating layer 316, the heat treatment after formation of the silicon oxide layer has an effect in diffusing an impurity such as hydrogen, moisture, a hydroxyl group, or a hydride contained in the oxide semiconductor layer to the oxide insulating layer so that the impurity contained in the oxide semiconductor layer can be further reduced.

Note that by forming the high-resistance drain region 314b (and the high-resistance source region 314a) in the oxide semiconductor layer overlapping with the drain electrode layer 315b (and the source electrode layer 315a), reliability of the thin film transistor can be improved. Specifically, by forming the high-resistance drain region 314b, the structure can be obtained in which conductivities of the drain electrode layer 315b, the high-resistance drain region 314b, and the channel formation region 313 vary in that order. Therefore, in the case where the thin film transistor operates with the drain electrode layer 315b connected to a wiring for supplying a high power supply potential VDD, the high-resistance drain region serves as a buffer and a high electric field is not applied locally even if a high electric field is applied between the gate electrode layer 311 and the drain electrode layer 315b; thus, the withstand voltage of the thin film transistor can be increased.

The high-resistance source region 314a or the high-resistance drain region 314b in the oxide semiconductor layer 331 is formed in the entire thickness direction in the case where the thickness of the oxide semiconductor layer 331 is 15 nm or smaller. However, in the case where the thickness of the oxide semiconductor layer 331 is 30 nm or larger, they are formed only in part of the oxide semiconductor layer 331, that is, in a region, which is in contact with the source electrode layer 315a or the drain electrode layer 315b, and the vicinity thereof. Therefore, a region which is close to the gate insulating film 331 can be made to be i-type.

A protective insulating layer 308 may be additionally formed over the oxide insulating layer 316. The protective insulating layer 308 is formed using an inorganic insulating film which does not contain impurities such as moisture, a hydrogen ion, and OH⁻ and blocks entry of these from the outside; for example, a silicon nitride film, an aluminum nitride film, a silicon nitride oxide film, an aluminum nitride oxide film, or the like. For example, a silicon nitride film is formed by an RF sputtering method. An RF sputtering method is preferable as a formation method of the protective insulating layer because of high productivity. In this embodiment, as the protective insulating layer, a protective insulating layer 306 is formed using a silicon nitride film (see FIG. 13E).

The substrate 305 over which layers up to the oxide insulating layer 316 have been formed is heated to a temperature of 100° C. to 400° C., a sputtering gas from which hydrogen and moisture are removed and which contains high-purity nitrogen is introduced, and a silicon target is used, whereby a silicon nitride layer is formed as the protective insulating layer 306. In this case, the protective insulating layer 306 is preferably formed after removing moisture in a treatment chamber, similarly to the oxide insulating layer 316.

After the formation of the protective insulating layer 308, heat treatment may be performed at 100° C. to 200° C. inclusive for one hour to 30 hours inclusive in the air. This heat treatment may be performed at a fixed temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. Under a reduced pressure, the heating time can be shortened.

Note that a planarization insulating layer for planarization may be provided over the protective insulating layer 306.

This embodiment can be implemented in appropriate combination with any of the other embodiments and examples.

Thus, with a thin film transistor including an oxide semiconductor layer, a large touch panel having stable electric characteristics and high reliability can be provided.

(Embodiment 7)

In this embodiment, another example of a thin film transistor which can be applied to the display panel disclosed in this specification will be described. A thin film transistor 360 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4). The same portions as those in the above embodiments and portions having functions similar to those of the portions in the above embodiments and steps similar to those in the above embodiments may be handled as in the above embodiments, and repeated description is omitted. In addition, detailed description of the same portions is also omitted.

An embodiment of a thin film transistor and a manufacturing method of the thin film transistor of this embodiment is described with reference to FIGS. 14A to 14D.

FIGS. 14A to 14D illustrate an example of a cross-sectional structure of a thin film transistor. The thin film transistor 360 illustrated in FIGS. 14A to 14D is one of bottom gate thin film transistors, which is called a channel protective thin film transistor (also referred to as a channel-stop thin film transistor), and is also referred to as an inverted staggered thin film transistor.

Although description is given using a single-gate thin film transistor as the thin film transistor 360, a multi-gate thin film transistor including a plurality of channel formation regions may be formed as needed.

A process of manufacturing the thin film transistor 360 over a substrate 320 is described below with reference to FIGS. 14A to 14D.

First, after a conductive film is formed over the substrate 320 having an insulating surface, the gate electrode layer 361 is formed in a first photolithography process. Note that a resist mask may be formed by an ink-jet method. When the resist mask is formed by an ink-jet method, a photomask is not used; therefore, manufacturing costs can be reduced.

Further, the gate electrode layer 361 can be formed with a single-layer structure or a layered structure using any of metal materials such as molybdenum, titanium, chromium, tantalum, tungsten, aluminum, copper, neodymium, and scandium, and an alloy material including any of these materials as a main component.

Then, the gate insulating layer 322 is formed over the gate electrode layer 361.

In this embodiment, a silicon oxynitride layer having a thickness of 100 nm is formed as the gate insulating layer 322 by a plasma CVD method.

Then, an oxide semiconductor layer is formed to a thickness of 2 nm to 200 nm inclusive over the gate insulating layer 322 and processed into an island-shaped oxide semiconductor layer in a second photolithography process. In this embodiment, the oxide semiconductor layer is formed by a sputtering method with the use of an In—Ga—Zn—O-based metal oxide target.

In that case, the oxide semiconductor layer is preferably formed removing moisture in the treatment chamber. This is for preventing hydrogen, a hydroxyl group, and moisture from being contained in the oxide semiconductor layer.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor layer formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide semiconductor layer is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 332 is obtained (see FIG. 14A).

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

Next, an oxide insulating layer is formed over the gate insulating layer 322 and the oxide semiconductor layer 332 and a third photolithography process is performed. A resist mask is formed and selective etching is performed, so that the oxide insulating layer 366 is formed. Then, the resist mask is removed.

In this embodiment, a silicon oxide film is formed to a thickness of 200 nm as the oxide insulating layer 366 by a sputtering method. The substrate temperature in film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or an atmosphere containing a rare gas (typically, argon) and oxygen. Further, a silicon oxide target or a silicon target can be used as a target. For example, the silicon oxide film can be formed using a silicon target by a sputtering method in an atmosphere containing oxygen and nitrogen. The oxide insulating layer 366 which is formed in contact with the oxide semiconductor layer in a region having a lower resistance is formed using an inorganic insulating film that does not contain impurities such as moisture, a hydrogen ion, and $HO^-$ and blocks entry of such impurities from the outside, typically, a silicon oxide film, a silicon oxynitride film, an aluminum oxide film, or an aluminum oxynitride film.

In that case, the oxide insulating layer 366 is preferably formed removing moisture in the treatment chamber. This is for preventing hydrogen, a hydroxyl group, and moisture from being contained in the oxide semiconductor layer 332 and the oxide insulating layer 366.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 366 formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide insulating layer 366 is formed.

Next, second heat treatment (preferably 200° C. to 400° C. inclusive, for example, from 250° C. to 350° C. inclusive) may be performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 366.

In this embodiment, heat treatment is further performed on the oxide semiconductor layer 332 over which the oxide insulating layer 366 is provided and part of the oxide semiconductor layer 332 is exposed, in an inert gas atmosphere such as nitrogen or under reduced pressure. By performing heat treatment in an inert gas atmosphere such as nitrogen or under reduced pressure, the resistance of regions of the oxide semiconductor layer 332, which are not covered with the oxide insulating layer 366 and are thus exposed, can be reduced. For example, heat treatment is performed in a nitrogen atmosphere at 250° C. for one hour.

With the heat treatment for the oxide semiconductor layer 332 provided with the oxide insulating layer 366 in a nitrogen atmosphere, the resistance of the exposed regions of the oxide semiconductor layer 332 is reduced. Thus, an oxide semiconductor layer 362 including regions with different resistances (indicated as shaded regions and white regions in FIG. 14B) are formed.

Next, after a conductive film is formed over the gate insulating layer 322, the oxide semiconductor layer 362, and the oxide insulating layer 366, and a fourth photolithography process is performed. A resist mask is formed and selective etching is performed, so that a source electrode layer 365a and a drain electrode layer 365b are formed. Then, the resist mask is removed (see FIG. 14C).

As the material of the source electrode layer 365a and the drain electrode layer 365b, there are an element selected from Al, Cr, Cu, Ta, Ti, Mo, or W; an alloy including any of the above elements; an alloy film containing a combination of any of these elements; and the like. Alternatively, a structure may be employed in which a high-melting-point metal layer of Cr, Ta, Ti, Mo, W, or the like is stacked over one of or both metal layers of Al, Cu, and the like. Still alternatively, when an Al material to which an element preventing generation of hillocks and whiskers in an Al film, such as Si, Ti, Ta, W, Mo, Cr, Nd, Sc, or Y, is added is used, heat resistance can be increased.

The source electrode layer 365a and the drain electrode layer 365b may each have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given.

Alternatively, the source electrode layer 365a and the drain electrode layer 365b may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

Through the above steps, the oxide semiconductor layer which has been formed is decreased in resistance by the heat treatment for dehydration or dehydrogenation, and then part of the oxide semiconductor layer is selectively changed to be in an oxygen excess state. As a result, the channel formation region 363 which overlaps with the gate electrode layer 361 becomes intrinsic, and a high-resistance source region 364a and a high-resistance drain region 364b which overlap with the source electrode layer 365a and the drain electrode layer 365b, respectively, are formed in a self-aligned manner. Thus, the thin film transistor 360 is formed.

Note that by forming the high-resistance drain region 364b (and the high-resistance source region 364a) in the oxide semiconductor layer overlapping with the drain electrode layer 365b (and the source electrode layer 365a), reliability of the thin film transistor can be improved. Specifically, by forming the high-resistance drain region 364b, the structure can be obtained in which conductivities of the drain electrode layer 365b, the high-resistance drain region 364b, and the channel formation region 363 vary. Therefore, in the case where the thin film transistor operates with the drain electrode layer 365b connected to a wiring for supplying a high power supply potential VDD, the high-resistance drain region serves as a buffer and a high electric field is not applied locally even if a high electric field is applied between the gate electrode layer 361 and the drain electrode layer 365b; thus, the withstand voltage of the thin film transistor can be increased.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 14D).

Note that an oxide insulating layer may be further formed over the source electrode layer 365a, the drain electrode layer 365b, and the oxide insulating layer 366, and the protective insulating layer 323 may be stacked over the oxide insulating layer.

This embodiment can be implemented in appropriate combination with any of the other embodiments and examples.

Thus, with a thin film transistor including an oxide semiconductor layer, a large touch panel having stable electric characteristics and high reliability can be provided.

(Embodiment 8)

In this embodiment, another example of a thin film transistor which can be applied to the display panel disclosed in this specification will be described. A thin film transistor 350 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4). The same portions as those in the above embodiments and portions having functions similar to those of the portions in the above embodiments and steps similar to those in the above embodiments may be handled as in the above embodiments, and repeated description is omitted. In addition, detailed description of the same portions is also omitted.

An embodiment of a thin film transistor and a manufacturing method of the thin film transistor of this embodiment is described with reference to FIGS. 15A to 15D.

Although description is given using a single-gate thin film transistor as a thin film transistor 350, a multi-gate thin film transistor including a plurality of channel formation regions may be formed as needed.

A process of manufacturing the thin film transistor 350 over a substrate 340 is described below with reference to FIGS. 15A to 15D.

First, after a conductive film is formed over the substrate 340 having an insulating surface, a gate electrode layer 351 is formed in a first photolithography process. In this embodiment, a tungsten film is formed as the gate electrode layer 351 to a thickness of 150 nm.

Then, a gate insulating layer 342 is formed over the gate electrode layer 351. In this embodiment, a silicon oxynitride layer is formed as the gate insulating layer 342 to a thickness of 100 nm by a plasma CVD method.

Next, after a conductive film is formed over the gate insulating layer 342, and a second photolithography process is performed. A resist mask is formed and selective etching is performed, so that a source electrode layer 355a and a drain electrode layer 355b are formed. Then, the resist mask is removed (see FIG. 15A).

Figure 15A:
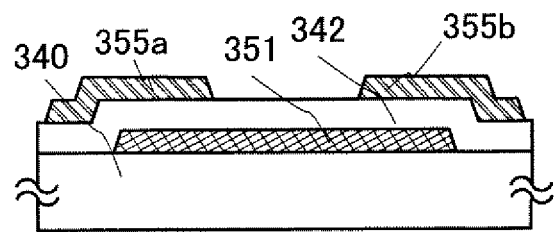
FIGS. 15A to 15D illustrate a thin film transistor and a method for manufacturing the thin film transistor.
Figure 15B:
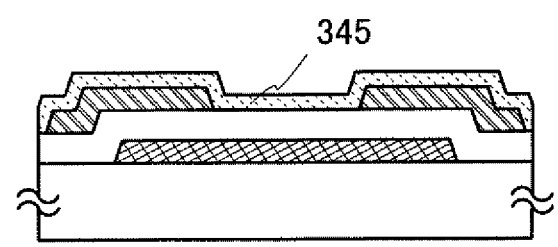
Figure 15C:
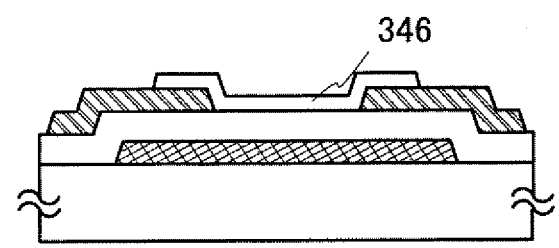
Figure 15D:
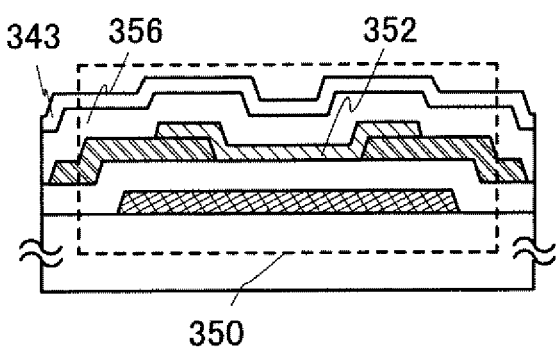

Then, an oxide semiconductor layer 345 is formed (see FIG. 15B). In this embodiment, the oxide semiconductor layer 345 is formed by a sputtering method with the use of an In—Ga—Zn—O-based metal oxide target. The oxide semiconductor layer 345 is processed into an island-shaped oxide semiconductor layer in a third photolithography process.

In that case, the oxide semiconductor layer 345 is preferably formed removing moisture in the treatment chamber. This is for preventing hydrogen, a hydroxyl group, and moisture from being contained in the oxide semiconductor layer 345.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor layer 345 formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide semiconductor layer 345 is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 346 is obtained (see FIG. 15C).

As the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Then, an oxide insulating layer 356 which serves as a protective insulating film and is in contact with the oxide semiconductor layer 346 is formed.

The oxide insulating layer 356 can be formed to a thickness of larger than or equal to 1 nm by a sputtering method or the like as appropriate, which is a method with which an impurity such as water or hydrogen does not enter the oxide insulating layer 356. When hydrogen is contained in the oxide insulating layer 356, entry of the hydrogen to the oxide semiconductor layer or extraction of oxygen in the oxide semiconductor layer by the hydrogen is caused, whereby a back channel of the oxide semiconductor layer comes to have a lower resistance (to be n-type) and thus a parasitic channel might be formed. Therefore, it is important that a formation method in which hydrogen is not used is employed so that the oxide insulating layer 356 is formed containing as little hydrogen as possible.

In this embodiment, a silicon oxide film is formed to a thickness of 200 nm as the oxide insulating layer 356 by a sputtering method. The substrate temperature in film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or an atmosphere containing a rare gas (typically, argon) and oxygen. Further, a silicon oxide target or a silicon target can be used as a target. For example, the silicon oxide film can be formed using a silicon target by a sputtering method in an atmosphere containing oxygen and nitrogen. The oxide insulating layer 356 which is formed in contact with the oxide semiconductor layer in a region having a lower resistance is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 356 is preferably formed removing moisture in the treatment chamber. This is for preventing hydrogen, a hydroxyl group, and moisture from being contained in the oxide semiconductor layer 352 and the oxide insulating layer 356.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 356 formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide insulating layer 356 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 356.

Through the above steps, the formed oxide semiconductor layer is decreased in resistance by the heat treatment for dehydration or dehydrogenation, and then part of the oxide semiconductor layer is selectively changed to be in an oxygen excess state. As a result, the i-type oxide semiconductor layer 352 is formed. Through the above steps, the thin film transistor 350 is formed.

A protective insulating layer may be additionally formed over the oxide insulating layer 356. For example, a silicon nitride film is formed by an RF sputtering method. In this embodiment, as the protective insulating layer, a protective insulating layer 343 is formed using a silicon nitride film (see FIG. 15D).

Note that a planarization insulating layer for planarization may be provided over the protective insulating layer 343.

This embodiment can be implemented in appropriate combination with any of the other embodiments and examples.

Thus, with a thin film transistor including an oxide semiconductor layer, a large touch panel having stable electric characteristics and high reliability can be provided.

(Embodiment 9)

In this embodiment, another example of a thin film transistor which can be applied to the display panel disclosed in this specification will be described. A thin film transistor 380 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4).

Figure 16:
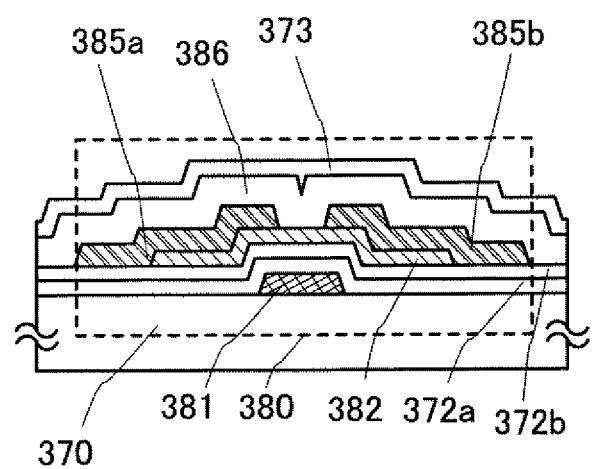
FIG. 16 illustrates a thin film transistor.

In this embodiment, an example which is partly different from Embodiment 6 in the manufacturing process of a thin film transistor will be described with reference to FIG. 16. Since FIG. 16 is the same as FIGS. 13A to 13E except for part of the steps, common reference numerals are used for the same portions, and detailed description of the same portions is omitted.

According to Embodiment 6, a gate electrode layer 381 is formed over a substrate 370, and a first gate insulating layer 372a and a second gate insulating layer 372b are stacked thereover. In this embodiment, a gate insulating layer has a two layer structure in which a nitride insulating layer and an oxide insulating layer are used as the first gate insulating layer 372a and the second gate insulating layer 372b, respectively.

As the oxide insulating layer, a silicon oxide layer, a silicon oxynitride layer, an aluminum oxide layer, an aluminum oxynitride layer, a hafnium oxide layer, or the like may be used. As the nitride insulating layer, a silicon nitride layer, a silicon nitride oxide layer, an aluminum nitride layer, an aluminum nitride oxide layer, or the like may be used.

In this embodiment, the gate insulating layer may have a structure where a silicon nitride layer and a silicon oxide layer are stacked over the gate electrode layer 381. A silicon nitride layer ($SiN_y$ ($y>0$)) with a thickness of 50 nm to 200 nm inclusive (50 nm in this embodiment) is formed by a sputtering method as a first gate insulating layer 372a and a silicon oxide layer ($SiO_x$ ($x>0$)) with a thickness of 5 nm to 300 nm inclusive (100 nm in this embodiment) is stacked as a second gate insulating layer 372b over the first gate insulating layer 372a; thus, the gate insulating layer with a thickness of 150 nm is formed.

Next, the oxide semiconductor layer is formed and then processed into an island-shaped oxide semiconductor layer in a photolithography process. In this embodiment, the oxide semiconductor layer is formed by a sputtering method with the use of an In—Ga—Zn—O-based metal oxide target.

In that case, the oxide semiconductor layer is preferably formed removing moisture in the treatment chamber. This is for preventing hydrogen, a hydroxyl group, and moisture from being contained in the oxide semiconductor layer.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor layer formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide semiconductor layer is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 425° C. Note that in the case of the temperature that is 425° C. or more, the heat treatment time may be one hour or less, whereas in the case of the temperature less than 425° C., the heat treatment time is longer than one hour. Here, the substrate is introduced into an electric furnace which is one of heat treatment apparatuses, heat treatment is performed on the oxide semiconductor layer in a nitrogen atmosphere, and then, the oxide semiconductor layer is not exposed to the air so that entry of water and hydrogen into the oxide semiconductor layer is prevented. Thus, the oxide semiconductor layer is obtained. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Note that the heat treatment apparatus is not limited to the electric furnace, and for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. An LRTA apparatus may be provided with not only a lamp but also a device for heating an object to be processed by heat conduction or heat radiation from a heater such as a resistance heater. GRTA is a method for performing heat treatment using a high-temperature gas. As the gas, an inert gas which does not react with an object to be processed with heat treatment, such as nitrogen or a rare gas such as argon is used. Alternatively, the heat treatment may be performed at 600° C. to 750° C. for several minutes by an RTA method.

Moreover, after the first heat treatment for dehydration or dehydrogenation, heat treatment may be performed at from 200° C. to 400° C., preferably from 200° C. to 300° C., in an oxygen gas atmosphere or a $N_2O$ gas atmosphere.

The first heat treatment of the oxide semiconductor layer may be performed before processing the oxide semiconductor layer into the island-like oxide semiconductor layer. In that case, after the first heat treatment, the substrate is taken out of the heating apparatus and a photolithography step is performed.

Through the above process, an entire region of the oxide semiconductor layer is made to be in an oxygen excess state; thus, the oxide semiconductor layer has higher resistance, that is, the oxide semiconductor layer becomes i-type. Accordingly, oxide semiconductor layer 382 whose entire region is i-type is formed.

Next, a conductive film is formed over the oxide semiconductor layer 382, and a photolithography process is performed. A resist mask is formed over the conductive film and the conductive film is etched selectively, whereby a source electrode layer 385a and a drain electrode layer 385b are formed. Then, an oxide insulating layer 386 is formed over the second gate insulating layer 372b, the oxide semiconductor layer 382, the source electrode layer 385a, and the drain electrode layer 385b by a sputtering method.

In that case, the oxide insulating layer 386 is preferably formed removing moisture in the treatment chamber. This is for preventing hydrogen, a hydroxyl group, and moisture from being contained in the oxide semiconductor layer 382 and the oxide insulating layer 386.

In order to remove moisture in the treatment chamber, an entrapment vacuum pump is preferably used. For example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 386 formed in the deposition chamber can be reduced.

It is preferable to use a high-purity gas from which an impurity such as hydrogen, water, a hydroxyl group, or a hydride is removed to a concentration of several ppm or several ppb, as a sputtering gas used when the oxide insulating layer 386 is formed.

Through the above steps, a thin film transistor 380 can be formed.

Next, in order to reduce variation in electric characteristics of the thin film transistors, heat treatment (preferably at 150° C. or higher and lower than 350° C.) may be performed in an inert gas atmosphere such as a nitrogen gas atmosphere. For example, the heat treatment is performed in a nitrogen atmosphere at 250° C. for one hour.

A protective insulating layer 373 is formed over the oxide insulating layer 386. In this embodiment, the protective insulating layer 373 is formed to a thickness of 100 nm with the use of a silicon nitride film by a sputtering method.

The protective insulating layer 373 and the first gate insulating layer 372a each formed using a nitride insulating layer do not contain impurities such as moisture, hydrogen, a hydride, and hydroxide and has an effect of blocking entry of these from the outside.

Therefore, in a manufacturing process after formation of the protective insulating layer 373, entry of an impurity such as moisture from the outside can be prevented. Further, even after a device is completed as a semiconductor device having a display panel, such as a liquid crystal display device, entry of an impurity such as moisture from the outside can be prevented in the long term; therefore, long-term reliability of the device can be achieved.

Further, part of the second gate insulating layer 372b between the first gate insulating layer 372a and the protective insulating layer 373 formed using a nitride insulating layer may be removed so that the protective insulating layer 373 and the first gate insulating layer 372a are in contact with each other.

Accordingly, impurities such as moisture, hydrogen, a hydride, and hydroxide in the oxide semiconductor layer are reduced as much as possible and entry of such impurities is prevented, so that the concentration of impurities in the oxide semiconductor layer can be maintained to be low.

Note that a planarization insulating layer for planarization may be provided over the protective insulating layer 373.

This embodiment can be implemented in appropriate combination with any of the other embodiments and examples.

Thus, with a thin film transistor including an oxide semiconductor layer, a large display device having stable electric characteristics and high reliability can be provided.

(Embodiment 10)

In this embodiment, another example of a thin film transistor which can be applied to a display panel, which is disclosed in this specification, will be described. A thin film transistor described in this embodiment can be applied to the thin film transistor in any of Embodiments 1 to 9.

In this embodiment, an example of using a conductive material having a light-transmitting property for a gate electrode layer, a source electrode layer, and a drain electrode layer will be described. Therefore, part of this embodiment can be performed in a manner similar to that of the above embodiments, and repetitive description of the same portions as or portions having functions similar to those in the above embodiments and steps for manufacturing such portions will be omitted. In addition, detailed description of the same portions is not repeated.

For example, materials of the gate electrode layer, the source electrode layer, and the drain electrode layer can be a conductive material that transmits visible light, and any of the following metal oxides can be applied for example: an In—Sn—O-based metal oxide, an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof can be set in the range of greater than or equal to 50 nm and less than or equal to 300 nm, as appropriate. As a film formation method of the metal oxide used for the gate electrode layer, the source electrode layer, and the drain electrode layer, a sputtering method, a vacuum evaporation method (an electron beam evaporation method or the like), an arc discharge ion plating method, or a spray method is used. When a sputtering method is employed, film formation may be performed using a target including $SiO_2$ at a concentration of greater than or equal to 2 wt % and less than or equal to 10 wt %.

Note that the unit of the percentage of components in the conductive film that transmits visible light is atomic percent, and the percentage of components is evaluated by analysis using an electron probe X-ray microanalyzer (EPMA).

In a pixel provided with a thin film transistor, when a pixel electrode layer, another electrode layer (such as a capacitor electrode layer), or another wiring layer (such as a capacitor wiring layer) is formed using the conductive film that transmits visible light, a display device having high aperture ratio can be realized. Needless to say, it is preferable that a gate insulating layer, an oxide insulating layer, a protective insulating layer, and a planarization insulating layer in the pixel be also each formed using a film that transmits visible light.

In this specification, a film that transmits visible light means a film having such a thickness as to have transmittance of visible light between 75% and 100%. In the case where the film has conductivity, the film is also referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light between 50% and 75%.

When a thin film transistor has a light-transmitting property, the aperture ratio can be increased because light is transmitted even when the thin film transistor is provided so as to overlap with a display region or a photosensor and thus display or detection of light is not interfered. In addition, by using a film having a light-transmitting property for components of a thin film transistor, a high aperture ratio can be achieved even when one pixel is divided into a plurality of sub-pixels in order to realize a wide viewing angle. That is, a high aperture ratio can be maintained even when a group of high-density thin film transistors is provided, so that a sufficient area of a display region can be secured. For example, in the case where one pixel includes two to four sub-pixels, an aperture ratio can be improved because the thin film transistor has a light-transmitting property. Further, when a storage capacitor is formed using the same steps and the same materials as the component of the thin film transistor, the storage capacitor can also have a light-transmitting property; therefore, the aperture ratio can be further increased.

This embodiment can be implemented in appropriate combination with any of the other embodiments and examples.

(Embodiment 11)

In this embodiment, an example of a thin film transistor which can be applied to the display panel disclosed in this specification will be described. A thin film transistor 650 in this embodiment can be used as the thin film transistor formed using an oxide semiconductor layer including a channel formation region in any of the above embodiments (e.g., the transistors 201, 205, 206, and 301 in Embodiment 1, and the transistors 503 and 540 in Embodiments 3 and 4).

Figure 17:
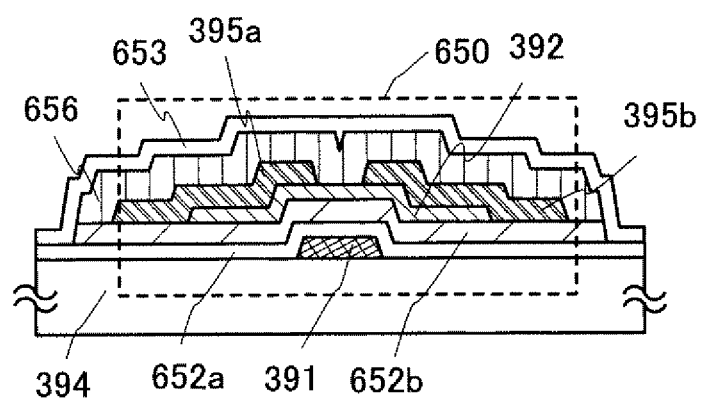
FIG. 17 illustrates a thin film transistor.

In this embodiment, an example in which an oxide semiconductor layer is surrounded by a nitride insulating film when seen in a cross section thereof will be shown with reference to FIG. 17, Since FIG. 17 is the same as FIGS. 12A to 12E except that there is differences in the top surface shape and the position of the end portion of an oxide insulating layer and in the structure of a gate insulating layer, common reference numerals are used for the same portions, and detailed description of the same portions is omitted.

The thin film transistor 650 illustrated in FIG. 17 is a bottom gate thin film transistor, and includes, over a substrate 394 having an insulating surface, a gate electrode layer 391, a gate insulating layer 652a which is formed using a nitride insulating layer, a gate insulating layer 652b which is formed using an oxide insulating layer, an oxide semiconductor layer 392, a source electrode layer 395a, and a drain electrode layer 395b. Further, an oxide insulating layer 656 which covers the thin film transistor 650 and is stacked over the oxide semiconductor layer 392 is provided. Further, a protective insulating layer 653 which is formed using a nitride insulating layer is provided over the oxide insulating layer 656. The protective insulating layer 653 is in contact with the gate insulating layer 652a which is formed using a nitride insulating layer.

In the thin film transistor 650 in this embodiment, the gate insulating layer has a stacked structure in which the nitride insulating layer and the oxide insulating layer are stacked over the gate electrode layer. Further, before the protective insulating layer 653 which is formed using a nitride insulating layer is formed, the oxide insulating layer 656 and the gate insulating layer 652b are selectively removed to expose the gate insulating layer 652a which is formed using a nitride insulating layer.

At least the top surfaces of the oxide insulating layer 656 and the gate insulating layer 652b are larger than the top surface of the oxide semiconductor layer 392, and the top surface shapes of the oxide insulating layer 656 and the gate insulating layer 652b preferably covers the thin film transistor 650.

Further, the protective insulating layer 653 which is fanned using a nitride insulating layer covers the top surface of the oxide insulating layer 656 and the side surfaces of the oxide insulating layer 656 and the gate insulating layer 652b, and is in contact with the gate insulating layer 652a which is formed using a nitride insulating layer.

For the protective insulating layer 653 and the gate insulating layer 652a which are each formed using a nitride insulating layer, an inorganic insulating film which does not contain impurities such as moisture, a hydrogen ion, and OH⁻ and blocks entry of the impurities from the outside is used: for example, a silicon nitride film, a silicon oxynitride film, an aluminum nitride film, or an aluminum oxynitride film obtained with a sputtering method or a plasma CVD method is used.

In this embodiment, as the protective insulating layer 653 which is for formed using a nitride insulating layer, a silicon nitride layer having a thickness of 100 nm is provided with an RF sputtering method so as to cover the bottom surface, the top surface, and the side surface of the oxide semiconductor layer 392.

With the structure illustrated in FIG. 17, an impurity such as hydrogen, moisture, a hydroxyl group, or a hydride in the oxide semiconductor layer is reduced due to the gate insulating layer 652b and the oxide insulating layer 656 which are provided to surround and be in contact with the oxide semiconductor layer, and entry of moisture from the outside in a manufacturing process after formation of the protective insulating layer 653 can be prevented because the oxide semiconductor layer is surrounded by the gate insulating layer 652a and the protective insulating layer 653 which are each formed using a nitride insulating layer. Further, even after a device is completed as a display panel, such as a display device, entry of an impurity such as moisture from the outside can be prevented in the long term; therefore, long-term reliability of the device can be achieved.

In this embodiment, one thin film transistor is covered with a nitride insulating layer; however, an embodiment of the present invention is not limited to this structure. Alternatively, a plurality of thin film transistors may be covered with a nitride insulating layer, or a plurality of thin film transistors in a pixel portion may be collectively covered with a nitride insulating layer. A region where the protective insulating layer 653 and the gate insulating layer 652a are in contact with each other may be formed so that at least the pixel portion of the active matrix substrate is surrounded.

This embodiment can be implemented in appropriate combination with any of the other embodiments and examples.

EXAMPLE 1

Figure 8:
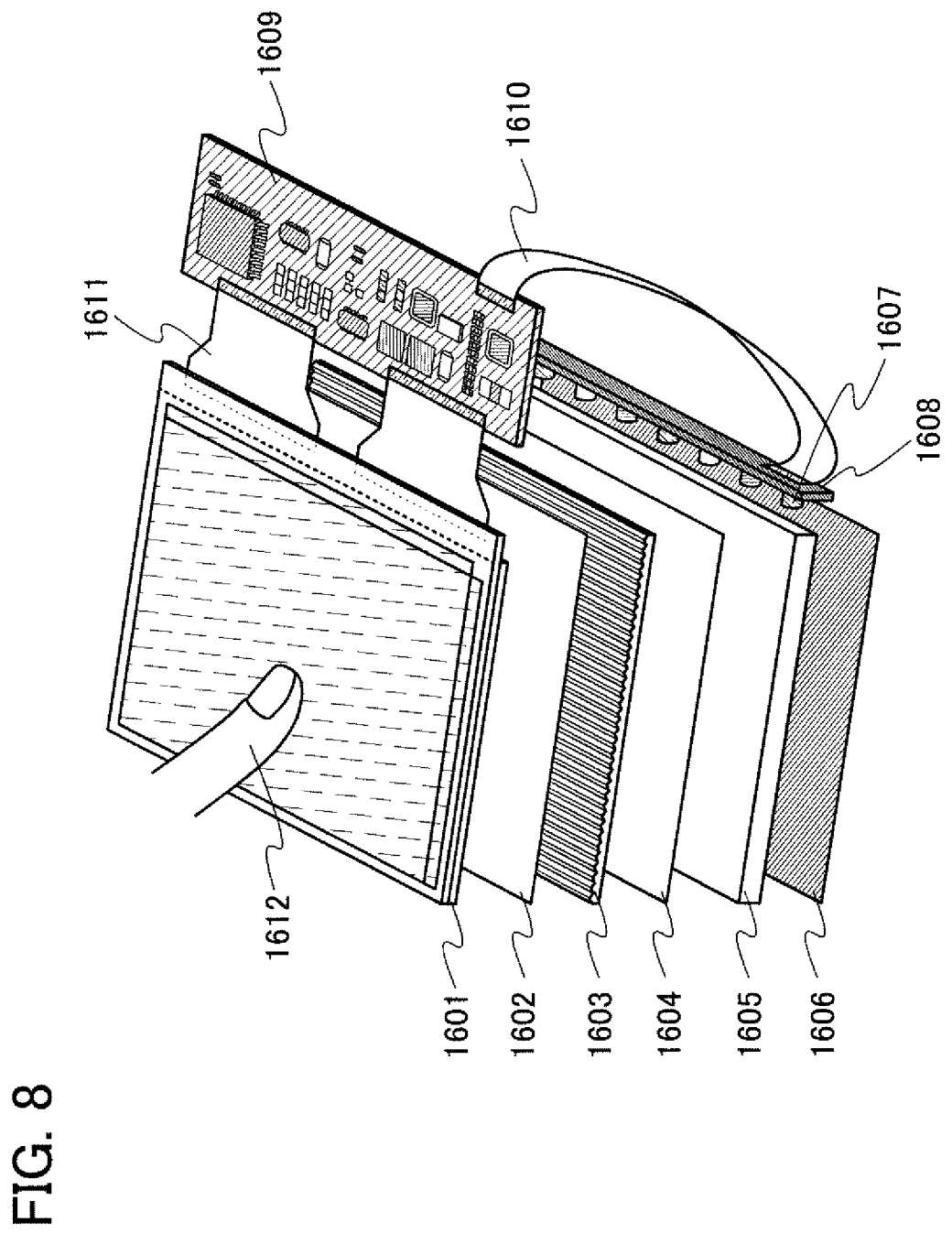
FIG. 8 illustrates a structure of a display panel.

In this example, arrangement of a panel and light sources in a display panel according to an embodiment of the present invention will be described. FIG. 8 illustrates an example of a perspective view of a structure of a display panel according to an embodiment of the present invention. The display panel illustrated in FIG. 8 is provided with a panel 1601 where pixels each including a liquid crystal element, a photodiode, a thin film transistor, and the like are formed between a pair of substrates; a first diffusing plate 1602; a prism sheet 1603; a second diffusing plate 1604; a light guide plate 1605; a reflection plate 1606; a backlight 1608 including a plurality of light sources 1607; and a circuit substrate 1609.

The panel 1601, the first diffusing plate 1602, the prism sheet 1603, the second diffusing plate 1604, the light guide plate 1605, and the reflection plate 1606 are stacked in this order. The light sources 1607 are provided in an end portion of the light guide plate 1605. Light from the light sources 1607 is diffused inside the light guide plate 1605, and passes through the first diffusing plate 1602, the prism sheet 1603, and the second diffusing plate 1604. Thus, the panel 1601 is uniformly irradiated with light from the counter substrate side (one side of the liquid crystal panel 1601, on which the light guide plate 1605 and the like are provided).

Although the first diffusing plate 1602 and the second diffusing plate 1604 are used in this embodiment, the number of diffusing plates is not limited thereto. The number of diffusing plates may be one, or may be three or more. The diffusing plate is acceptable as long as it is provided between the light guide plate 1605 and the panel 1601. Therefore, a diffusing plate may be provided only between the panel 1601 and the prism sheet 1603, or may be provided only between the light guide plate 1605 and the prism sheet 1603.

Further, the cross section of the prism sheet 1603 is not limited to a sawtooth shape illustrated in FIG. 8. The prism sheet 1603 may have a shape with which light from the light guide plate 1605 can be concentrated on the panel 1601 side.

The circuit substrate 1609 is provided with a circuit which generates various kinds of signals inputted to the panel 1601, a circuit which processes the signals, a circuit which processes various signals outputted from the panel 1601, or the like. In FIG. 8, the circuit substrate 1609 and the panel 1601 are connected to each other via a flexible printed circuit (FPC) 1611. Note that the circuit may be connected to the panel 1601 with a chip on glass (COG) method, or part of the circuit may be connected to the FPC 1611 with a chip on film (COF) method.

FIG. 8 shows an example in which the circuit substrate 1609 is provided with control circuits which control driving of the light sources 1607, where the control circuits and the light sources 1607 are connected via the FPC 1610. However, the above control circuits may be formed in the panel 1601; in this case, the panel 1601 and the light sources 1607 are connected via an FPC or the like.

Although FIG. 8 shows an example of an edge-light type light source in which the light sources 1607 are disposed in an end portion of the panel 1601, a touch panel according to an embodiment of the present invention may be a direct-below type that includes the light sources 1607 disposed directly below the panel 1601.

When a finger 1612, which is an object, gets close to the panel 1601 from the TFT substrate side (the side over the panel 1601, which is opposite to the backlight 1608), light from the backlight 1608 passes through the panel 1601, and part of the light is reflected by the finger 1612 and enters the panel 1601 again. Image data of the finger 1612, which is the object, can be obtained by obtaining image data with the photosensors 106 in the pixels 104.

This embodiment can be implemented in appropriate combination with any of the other embodiments and the other example.

EXAMPLE 2

The display panel according to an embodiment of the present invention can input data by detecting motion of a contactless object. Therefore, an electronic device having the display panel according to an embodiment of the present invention can be equipped with a more highly functional application due to the display panel added as a component. The display panel according to an embodiment of the present invention can be included in display devices, laptop personal computers, and image reproducing devices provided with recording media (typically devices which reproduce the content of recording media such as DVDs (digital versatile discs) and include displays for displaying the reproduced images). In addition to the above examples, as an electronic device which can include the display panel according to an embodiment of the present invention, mobile phones, portable game consoles, portable information terminals, e-book readers, video cameras, digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of these electronic devices are illustrated in FIGS. 9A to 9D.

Figure 9A:
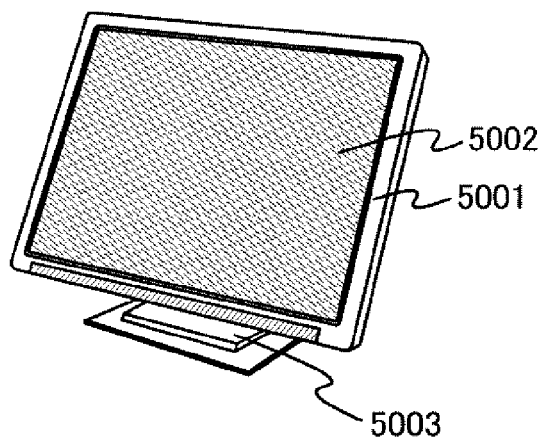
FIGS. 9A to 9D each illustrate an example of an electronic device having a display panel.

FIG. 9A illustrates a display device that includes a housing 5001, a display portion 5002, a support 5003, and the like. The display panel according to an embodiment of the present invention can be used for the display portion 5002. The display panel according to an embodiment of the present invention used for the display portion 5002 makes it possible to provide a display device which is capable of capturing image shooting data with high resolution and is equipped with more highly functional applications. Note that a display device includes all display devices for displaying information, such as display devices for personal computers, for receiving television broadcasts, and for displaying advertisements.

Figure 9B:
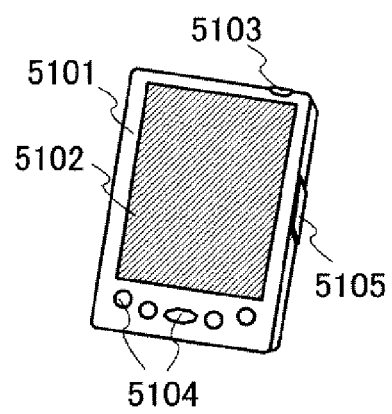

FIG. 9B illustrates a portable information terminal that includes a housing 5101, a display portion 5102, a switch 5103, operation keys 5104, an infrared port 5105, and the like. The display panel according to an embodiment of the present invention can be used for the display portion 5102. The display panel according to an embodiment of the present invention used for the display portion 5102 makes it possible to provide a portable information terminal which is capable of capturing image shooting data with high resolution and is equipped with more highly functional applications.

Figure 9C:
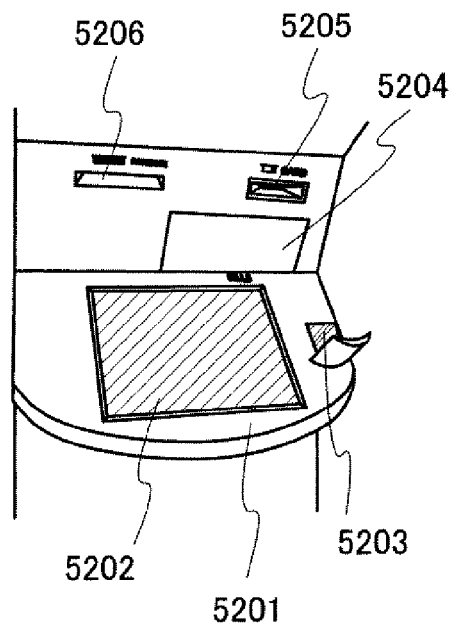

FIG. 9C illustrates an automated teller machine that includes a housing 5201, a display portion 5202, a coin slot 5203, a paper money slot 5204, a card slot 5205, a passbook slot 5206, and the like. The display panel according to an embodiment of the present invention can be used for the display portion 5202. The display panel according to an embodiment of the present invention used for the display portion 5202 makes it possible to provide an automated teller machine which is capable of capturing image shooting data with high resolution and is equipped with more highly functional applications. An automated teller machine using the display panel according to an embodiment of the present invention can read, with higher precision, biological information to be used for biometric authentication, such as a fingerprint, a face, a hand print, a palm print, a hand vein pattern, or an iris. Therefore, a false non-match rate which is caused by false recognition of a person to be identified as a different person and a false acceptance rate which is caused by false recognition of a different person as a person to be identified can be suppressed.

Figure 9D:
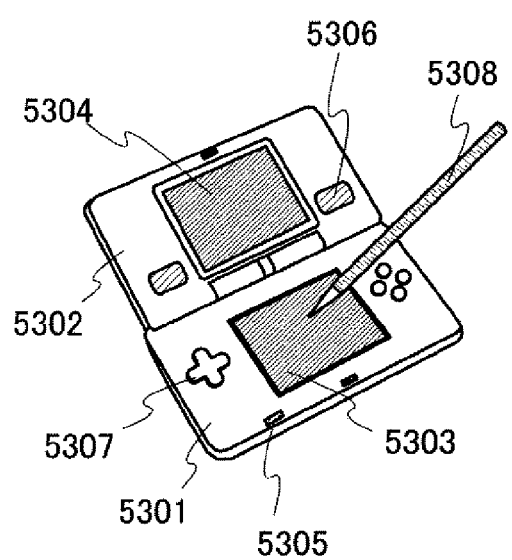

FIG. 9D illustrates a portable game console that includes a housing 5301, a housing 5302, a display portion 5303, a display portion 5304, a microphone 5305, a speaker 5306, an operation key 5307, a stylus 5308, and the like. The display panel according to an embodiment of the present invention can be used for the display portion 5303 or the display portion 5304. The display panel according to an embodiment of the present invention used for the display portion 5303 or the display portion 5304 makes it possible to provide a portable game console which is capable of capturing image shooting data with high resolution and is equipped with more highly functional applications. Note that although the portable game console illustrated in FIG. 9D includes two display portions, the display portions 5303 and 5304, the number of display portions included in the portable game console is not limited thereto.

This embodiment can be implemented in appropriate combination with any of the other embodiments and the other example.

This application is based on Japanese Patent Application serial no. 2009-255452 filed with Japan Patent Office on Nov. 6, 2009, the entire contents of which are hereby incorporated by reference.

EXPLANATION OF REFERENCE

100: display panel, 101: pixel circuit, 102: display element control circuit, 103: photosensor control circuit, 104: pixel, 105: display element, 106: photosensor, 107: display element driver circuit, 108: display element driver circuit, 109: circuit, 110: photosensor driver circuit, 201: transistor, 202: storage capacitor, 203: liquid crystal element, 204: photodiode, 205: transistor, 206: transistor, 207: gate signal line, 208: photodiode reset signal line, 209: gate signal line, 210: video data signal line, 211: photosensor output signal line, 212: photosensor reference signal line, 213: gate signal line, 300: circuit, 301: transistor, 302: storage capacitor, 303: precharge signal line, 305: substrate, 306: protective insulating layer, 307: gate insulating layer, 310: thin film transistor, 311: gate electrode layer, 313: channel formation region, 314a: high-resistance source region, 314b: high-resistance drain region, 315a: source electrode layer, 315b: drain electrode layer, 316: oxide insulating layer, 320: substrate, 322: gate insulating layer, 323: protective insulating layer, 330: oxide semiconductor layer, 331: oxide semiconductor layer, 332: oxide semiconductor layer, 340: substrate, 342: gate insulating layer, 343: protective insulating layer, 345: oxide semiconductor layer, 346: oxide semiconductor layer, 350: thin film transistor, 351: gate electrode layer, 352: oxide semiconductor layer, 355a: source electrode layer, 355b: drain electrode layer, 356: oxide insulating layer, 360: thin film transistor, 361: gate electrode layer, 362: oxide semiconductor layer, 363: channel formation region, 364a: high-resistance source region, 364b: high-resistance drain region, 365a: source electrode layer, 365b: drain electrode layer, 366: oxide insulating layer, 370: substrate, 372a: gate insulating layer, 372b: gate insulating layer, 373: protective insulating layer, 380: thin film transistor, 381: gate electrode layer, 382: oxide semiconductor layer, 385a: source electrode layer, 385b: drain electrode layer, 386:

oxide insulating layer, 390: thin film transistor, 391: gate electrode layer, 392: oxide semiconductor layer, 393: oxide semiconductor layer, 394: substrate, 395a: source electrode layer, 395b: drain electrode layer, 396: oxide insulating layer, 397: gate insulating layer, 398: protective insulating layer, 399: oxide semiconductor layer, 401: signal, 402: signal, 403: signal, 404: signal, 405: signal, 501: substrate, 502: photodiode, 503: transistor, 505: liquid crystal element, 506a: semiconductor layer, 506b: semiconductor layer, 506c: semiconductor layer, 507: pixel electrode, 508: liquid crystal, 509: counter electrode, 510: conductive film, 511: alignment film, 512: alignment film, 513: substrate, 514: color filter, 515: shielding film, 516: spacer, 517: polarizing plate, 518: polarizing plate, 520: arrow, 521: object, 522: arrow, 531: oxide insulating layer, 532: protective insulating layer, 533: interlayer insulating layer, 534: interlayer insulating layer, 540: transistor, 541: electrode layer, 542: electrode layer, 543: conductive layer, 545: gate electrode layer, 590: display panel system, 591: control circuit, 592: image processing circuit, 593: memory device, 650: thin film transistor, 652a: gate insulating layer, 652b: gate insulating layer, 653: protective insulating layer, 656: oxide insulating layer, 1601: panel, 1602: diffusing plate, 1603: prism sheet, 1604: diffusing plate, 1605: light guide plate, 1606: reflection plate, 1607: light source, 1608: backlight, 1609: circuit substrate, 1610: FPC, 1611: FPC, 1612: finger, 2001: area, 2002: area, 2003: area, 2004: area, 2005: pixel, 2006: pixel, 5001: housing, 5002: display portion, 5003: supporting base, 5101: housing, 5102: display portion, 5103: switch, 5104: operation key, 5105: infrared rays port, 5201: housing, 5202: display portion, 5203: coin slot, 5204: bill slot, 5205: card slot, 5206: bankbook slot, 5301: housing, 5302: housing, 5303: display portion, 5304: display portion, 5305: microphone, 5306: speaker, 5307: operation key, and 5308: stylus.

The invention claimed is:

1. A display device comprising:
a display panel including pixels arranged in matrix, the pixels including first pixels and second pixels; and
an image processing portion operationally connected to the display panel,
wherein each of the first pixels includes:
   a first photosensor including a photodiode; and
   a first transistor having an oxide semiconductor layer,
wherein each of the second pixels includes:
   a second photosensor including a second photodiode; and
   a second transistor having an oxide semiconductor layer,
   wherein each of the first photosensor detects a shadow of an object which is not in contact with the display panel projected on the display panel,
wherein the image processing portion is configured to detect a position of the object using data of the shadow of the object, which is obtained by the first photosensor,
wherein the second pixels surround the first pixels, and
wherein the first pixels is not contact with each other.

2. The display device according to claim 1,
wherein the image processing portion is configured to detect motion of the object by comparing successive data of the position of the object.

3. The display device according to claim 1,
wherein each of the first pixels and the second pixels further includes a display element.

4. The display device according to claim 1,
wherein the image processing portion is configured to recognize a region including the largest number of pixels detecting the shadow among a plurality of regions obtained by dividing the display panel, as positional data of the object.

5. A display device comprising:
a display panel including pixels arranged in matrix, the pixels including first pixels and second pixels; and
an image processing portion operationally connected to the display panel,
wherein each of the first pixels includes:
   a first photosensor including a first photodiode;
   a first transistor having a stack structure including a gate, a gate insulating layer, and an oxide semiconductor layer;
   a first pixel electrode; and
   a first color filter over the first photosensor and the first pixel electrode,
wherein each of the second pixels includes:
   a second photosensor including a second photodiode;
   a second transistor having a stack structure including a gate, a gate insulating layer, and an oxide semiconductor layer;
   a second pixel electrode; and
   a second color filter over the second photosensor and the second pixel electrode,
   wherein the first photosensor is coupled with the first color filter to detect external light incident through the first color filter and to detect a shadow of an object which is not in contact with the display panel projected on the display panel,
   wherein the second photosensor is coupled with the second color filter to detect external light incident through the second color filter and to detect a presence of the object which is in contact with the display panel,
wherein the image processing portion is configured to detect a position of the object using data of the shadow of the object, which is obtained by the first photosensor,
wherein the first photosensor is electrically connected to the gate of the first transistor, and the second photosensor is electrically connected to the gate of the second transistor,
wherein the first photodiode is fully covered by the first color filter so that the first photosensor detects the external light processed by a colorant included in the first color filter,
wherein the second photodiode is fully covered by the second color filter so that the second photosensor detects the external light processed by a colorant included in the second color filter,
wherein the first color filter overlaps with the first pixel electrode,
wherein the second color filter overlaps with the second pixel electrode,
wherein the second pixels surround the first pixels, and
wherein the first pixels is not contact with each other.

6. The display device according to claim 5,
wherein the image processing portion is configured to detect motion of the object by comparing successive data of the position of the object.

7. The display device according to claim 5,
wherein the image processing portion is configured to recognize a region including the largest number of pixels detecting the shadow among a plurality of regions obtained by dividing the display panel, as positional data of the object.

8. The display device according to claim 1,
wherein each of the first pixels further comprises a third transistor which is electrically connected to the first transistor in series, and
wherein each of the second pixels further comprises a fourth transistor which is electrically connected to the second transistor in series.

9. The display device according to claim 8,
wherein the third transistor has an oxide semiconductor layer, and
wherein the fourth transistor has an oxide semiconductor layer.

10. The display device according to claim 1,
wherein each of the first photosensor and the second photosensor has a stack of a p-type semiconductor layer and an n-type semiconductor with an i-type semiconductor layer sandwiched therebetween.

11. The display device according to claim 5,
wherein each of the first pixels and the second pixels further includes a display element.

12. The display device according to claim 1,
wherein the first photosensor is located over the first transistor, and
wherein the second photosensor is located over the second transistor.

13. The display device according to claim 5,
wherein each of the first pixels further comprises a third transistor which is electrically connected to the first transistor in series, and
wherein each of the second pixels further comprises a fourth transistor which is electrically connected to the second transistor in series.

14. The display device according to claim 13,
wherein the third transistor has an oxide semiconductor layer, and
wherein the fourth transistor has an oxide semiconductor layer.

15. The display device according to claim 5,
wherein each of the first photosensor and the second photosensor has a stack of a p-type semiconductor layer and an n-type semiconductor with an i-type semiconductor layer sandwiched therebetween.

16. The display device according to claim 5,
wherein the first photosensor is located over the first transistor, and
wherein the second photosensor is located over the second transistor.

* * * * *